(12) United States Patent
Refai-Ahmed et al.

(10) Patent No.: US 10,720,377 B2
(45) Date of Patent: Jul. 21, 2020

(54) ELECTRONIC DEVICE APPARATUS WITH MULTIPLE THERMALLY CONDUCTIVE PATHS FOR HEAT DISSIPATION

(71) Applicant: Xilinx, Inc., San Jose, CA (US)

(72) Inventors: Gamal Refai-Ahmed, Santa Clara, CA (US); Ho Hyung Lee, San Jose, CA (US); Hui-Wen Lin, San Jose, CA (US); Henley Liu, San Jose, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/186,178

(22) Filed: Nov. 9, 2018

(65) Prior Publication Data

US 2020/0152546 A1 May 14, 2020

(51) Int. Cl.
*H01L 29/40* (2006.01)
*H01L 23/40* (2006.01)
*H01L 23/48* (2006.01)
*H01L 23/00* (2006.01)
*H01L 23/427* (2006.01)

(52) U.S. Cl.
CPC ........ *H01L 23/4006* (2013.01); *H01L 23/427* (2013.01); *H01L 23/481* (2013.01); *H01L 24/13* (2013.01); *H01L 24/16* (2013.01); *H01L 2023/405* (2013.01); *H01L 2023/4043* (2013.01); *H01L 2023/4062* (2013.01); *H01L 2023/4068* (2013.01); *H01L 2224/13025* (2013.01); *H01L 2224/16227* (2013.01); *H01L 2224/17519* (2013.01)

(58) Field of Classification Search
CPC ......... H01L 24/13; H01L 24/16; H01L 24/32; H01L 23/3114; H01L 23/34; H01L 23/482; H01L 23/49513; H01L 23/53228; H01L 23/535
USPC .......................................... 257/621
See application file for complete search history.

(56) References Cited

U.S. PATENT DOCUMENTS

2018/0261528 A1* 9/2018 Chen .................. H01L 25/0652

* cited by examiner

*Primary Examiner* — Theresa T Doan
(74) *Attorney, Agent, or Firm* — Patterson + Sheridan, LLP

(57) ABSTRACT

Examples described herein provide for an electronic device apparatus with multiple thermally conductive paths for heat dissipation. In an example, an electronic device apparatus includes a package comprising a die attached to a package substrate. The electronic device apparatus further includes a ring stiffener disposed around the die and on the package substrate, a heat sink disposed on the package, and a wedge disposed between the heat sink and the ring stiffener.

20 Claims, 14 Drawing Sheets

ELECTRONIC DEVICE APPARATUS WITH MULTIPLE THERMALLY CONDUCTIVE PATHS FOR HEAT DISSIPATION

TECHNICAL FIELD

Examples of the present disclosure generally relate to an electronic device apparatus and, in particular, to an electronic device apparatus with multiple thermally conductive paths for heat dissipation.

BACKGROUND

Electronic devices, such as are included in tablets, computers, copiers, digital cameras, smart phones, control systems, and automated teller machines, among others, often include integrated circuit (IC) die(s) for some desired functionality. IC dies can consume various amounts of electrical power. By consuming electrical power, IC dies can generate thermal energy. The thermal energy can accumulate in the IC die if the thermal energy is not dissipated by the transfer of heat. If thermal energy accumulates to too great of levels, and the IC die becomes too hot, deleterious effects may occur. For example, physical characteristics of devices in the IC die may be altered by excessive temperatures. As an example, threshold voltages of transistors in the IC die can vary as temperature changes. Further, migration of metal in the IC die can be increased by increased thermal energy. Accordingly, thermal management of electronic devices that include an IC die is a concern.

SUMMARY

Examples described herein provide for an electronic device apparatus with multiple thermally conductive paths for heat dissipation. In examples describe herein, the multiple thermally conductive paths can permit more efficient heat dissipation. Other examples described herein provide for a package structure with a ring stiffener that may provide, among other things, a greater surface area to permit more efficient heat dissipation.

An example of the present disclosure is an electronic device apparatus. The electronic device apparatus includes a package comprising a die attached to a package substrate. The electronic device apparatus further includes a ring stiffener disposed around the die and on the package substrate, a heat sink disposed on the package, and a wedge disposed between the heat sink and the ring stiffener.

Another example of the present disclosure is an electronic device apparatus. The electronic device apparatus includes a package comprising an integrated circuit (IC) die; a ring stiffener around at least a portion of the package and disposed on the package; a heat sink disposed on the package; and a wedge disposed between the ring stiffener and the heat sink. A thermally conductive path from the IC die to the heat sink includes the ring stiffener and the wedge.

A further example of the present disclosure is an electronic device apparatus. The electronic device apparatus includes an integrated circuit (IC) die and a package substrate. The IC die is mounted on a die receiving area of the package substrate. The package substrate has a ring contact area laterally around the die receiving area. The package substrate comprises a metallization connected between a first contact pad in the die receiving area and a second contact pad in the ring contact area. The electronic device apparatus also includes a ring stiffener around the IC die and on the ring contact area of the package substrate. The ring stiffener is thermally coupled to the second contact pad in the ring contact area. The electronic device apparatus further includes a heat sink adhered to the IC die and a wedge disposed between and thermally coupled to the ring stiffener and the heat sink.

A still further example of the present disclosure is a package structure. The package structure includes a package substrate, an IC die attached to the package substrate; and a multi-component ring stiffener on the package substrate and laterally around the IC die. The multi-component ring stiffener includes a lower ring stiffener attached to the package substrate, and includes an upper ring stiffener attached to the lower ring stiffener. The lower ring stiffener is disposed between the package substrate and the upper ring stiffener. The upper ring stiffener extends laterally beyond one or more lateral edges of the package substrate.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
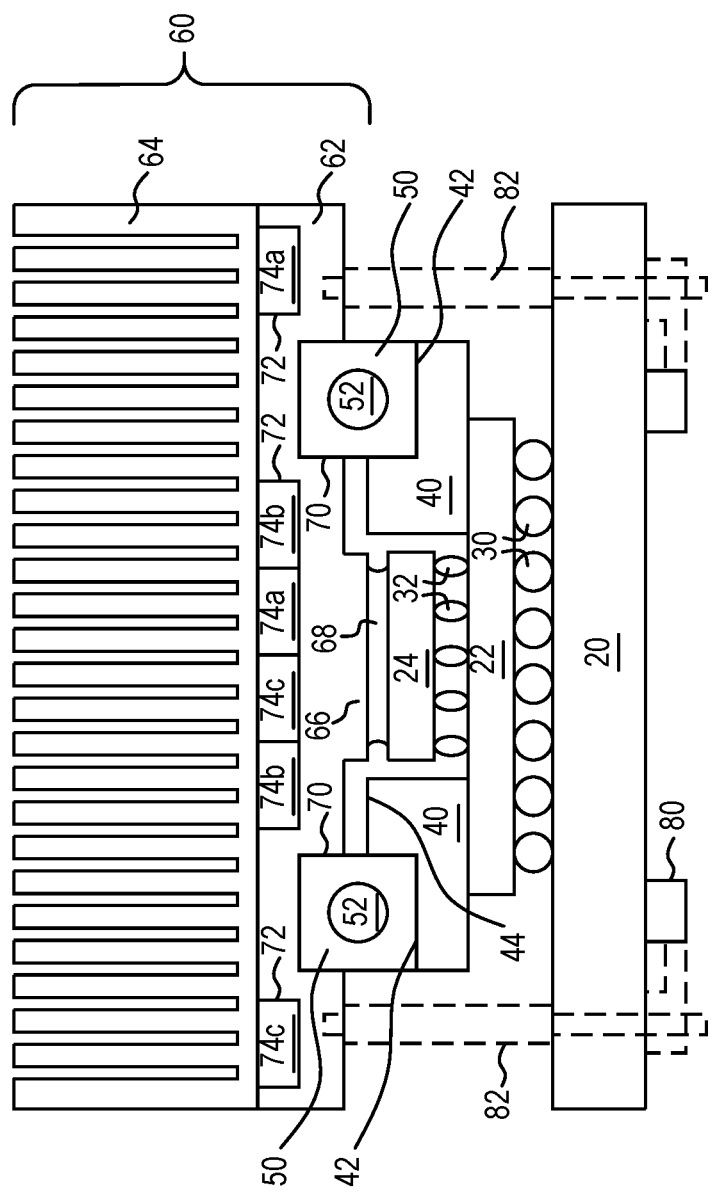
FIGS. 1A and 1B are a cross-sectional view and an exploded perspective view, respectively, of an electronic device apparatus, according to some examples.

Some examples described herein provide for an electronic device apparatus with multiple thermally conductive paths for heat dissipation. In some examples describe herein, an electronic device apparatus includes a package, a ring stiffener, a wedge, and a heat sink. The electronic device apparatus may further include a printed circuit board (PCB). The package includes an integrated circuit (IC) die on a package substrate. The ring stiffener is on the package substrate. Metallization is formed in the package to conduct thermal energy from the IC die to the ring stiffener. The wedge is on a lateral portion of the ring stiffener. The heat sink is adhered to the IC die by a thermal interface material (TIM) and contacts the wedge. Accordingly, a thermally conductive path can be formed from the IC die through the package substrate, ring stiffener, and wedge to the heat sink, and another thermally conductive path can be formed from the IC die through the TIM to the heat sink. With multiple thermally conductive paths, thermal energy generated by the IC die can be dissipated more efficiently.

Further, in some examples, the lateral portion of the ring stiffener can be laterally extended to a desired amount to provide a desired area for heat transfer between the ring stiffener and the wedge. A larger lateral portion with a larger area for contact with the wedge, for example, can permit larger heat transfer between the ring stiffener and the wedge. In some examples, the ring stiffener can be a single, integral component that provides an extended lateral or overhang portion from the package substrate, while in other examples, the ring stiffener can include multiple distinct components that are joined together where at least one of the components provides an extended lateral or overhang portion from the package substrate.

Still further examples described herein provide for a package structure. The package structure includes a package substrate with an IC die thereon. A multi-component ring stiffener is on the package substrate and around the IC die. The multi-component ring stiffener, in some examples, includes a lower ring stiffener and an upper ring stiffener. The lower ring stiffener can be attached to the package substrate and have lateral edges that are generally co-extensive with or laterally interior to the lateral edges of the package substrate. The upper ring stiffener can be subsequently joined to the lower ring stiffener (e.g., by a TIM) and can extend laterally from the lower ring stiffener. Hence, the upper ring stiffener can provide an extended lateral or overhang portion from the package substrate. The extended lateral or overhang portion can provide a greater surface area for heat transfer. Further, by implementing the multi-component ring stiffener, the lower ring stiffener can be attached to the package substrate while the package substrate is on a carrier, without, for example, having to retrofit the carrier to accommodate a larger ring stiffener. After the package substrate, with IC die and lower ring stiffener thereon, is removed from the carrier, the upper ring stiffener can be attached to the lower ring stiffener, such as after testing the package substrate and IC die. Hence, in some examples, various processing and testing can be performed, e.g., before attaching the laterally larger upper ring stiffener, without having to implement retrofitted tools or equipment that would have to be modified to handle a package structure including a larger ring stiffener.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 1B:
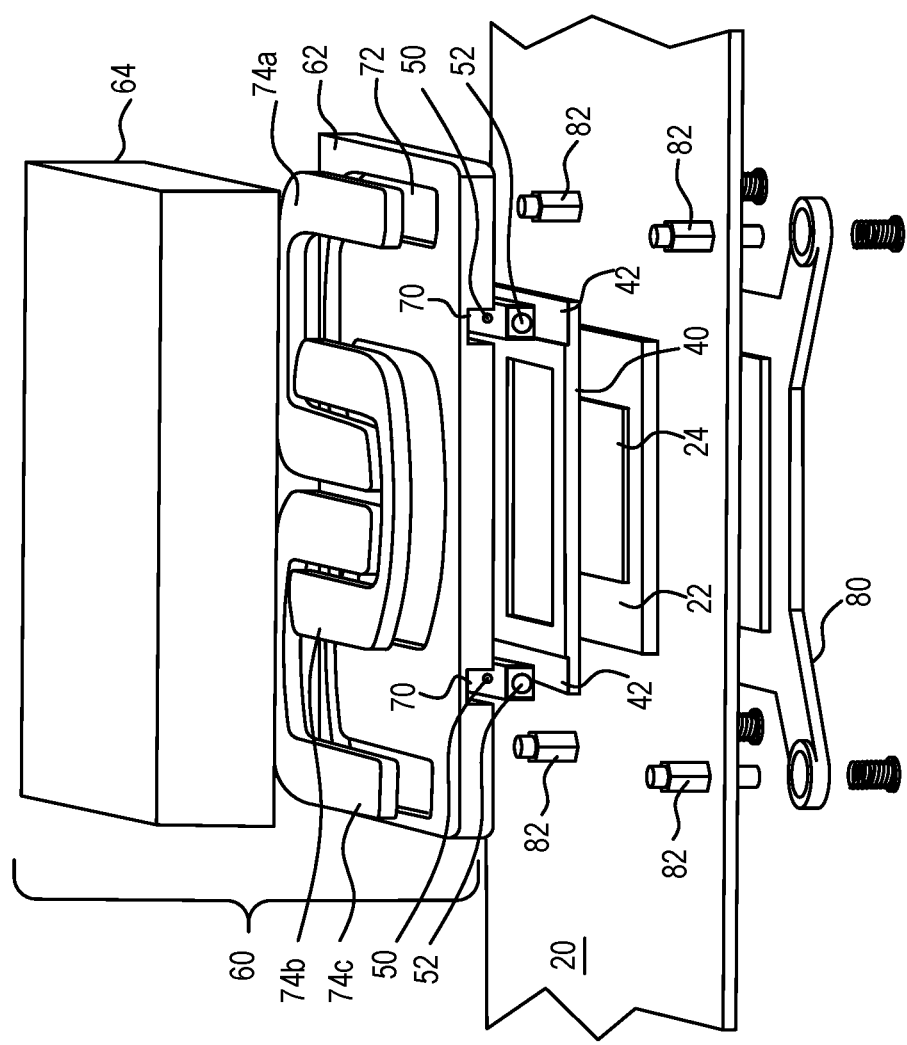

FIGS. 1A and 1B illustrate a cross-sectional view and an exploded perspective view, respectively, of an electronic device apparatus, according to some examples. The electronic device apparatus includes a package attached to a PCB 20. The package includes a package substrate 22 and an IC die 24 attached to a die receiving area of the package substrate 22. The package (e.g., the package substrate 22) is attached to the PCB 20 by external connectors 30 (e.g., electrically conductive connectors such as solder balls, ball grid array (BGA) balls, etc.). The IC die 24 is attached to the package substrate 22 by external connectors 32 (e.g., electrically conductive connectors such as bumps, controlled collapse chip connection (C4), etc.).

For ease of reference, a frontside and a backside of the IC die 24 may be used herein. The frontside and backside are opposing sides of the IC die. Further, a first side and a second side of the package substrate 22 may be used. The first side and second side are opposing sides of the package substrate 22. In the illustration of FIG. 1A, the external connectors 32 are attached to the frontside of the IC die 24 and to the die receiving area of the first side of the package substrate 22, and the external connectors 30 are attached to the second side of the package substrate 22.

Although a single IC die 24 is illustrated in the package, multiple IC dies may be included in the package. For example, multiple IC dies may be attached to a package substrate by external connectors, and/or multiple IC dies may be stacked with the bottom IC die being attached to a package substrate by conductive connectors. Further, the package can include an interposer attached to the package substrate, with one or more IC dies being attached to the package substrate.

The package is illustrated as not including an encapsulant (e.g., molding compound), but in some examples, the IC die 24 (or multiple IC dies) can be at least laterally encapsulated on the first side of the package substrate 22. Further, for example, a molding underfill (MUF) compound can be dispersed between the IC die 24 and the package substrate 22 and around the external connectors 32, which MUF compound may at least partially laterally encapsulate the IC die 24. In some examples, the backside of the IC die 24 (or backside of the IC die most distal from the package substrate when a die stack is implemented) is exposed through any encapsulant that may be implemented. Additional details of the IC die 24, package substrate 22, and external connectors 32 are described with respect to subsequent figures.

A ring stiffener 40 is disposed on the package substrate 22 and around the IC die 24. The ring stiffener 40 contacts or is attached to a ring contact area of the first side of the package substrate 22, for example. The ring contact area, and hence, the ring stiffener 40, can be laterally exterior to, and may further surround, the die receiving area of the first side of the package substrate. The ring stiffener 40 can be formed of, e.g., a metal that has mechanical strength to provide additional structural integrity and that is capable of conducting thermal energy. As will be described further below, a thermally conductive path can be formed through the ring stiffener 40.

The ring stiffener 40 can be flat on a side that contacts or is attached to the ring contact area on the first side of the package substrate 22. In some examples, the ring stiffener 40 may not be adhered or specifically attached to the first side of the package substrate 22, while in other examples, the ring stiffener 40 is adhered to the ring contact area on the first side of the package substrate 22, such as by using a thermally conductive adhesive, like TIM (e.g., thermal grease, etc.). The ring stiffener 40 has recessed lateral portions 42 laterally exterior to an inner portion 44 on a side facing away from the package substrate 22. The recessed lateral portions 42 have a thickness that is less than a thickness of the inner portion 44. A step can be formed as a transition between the inner portion 44 and the recessed lateral portion 42 on the side of the ring stiffener 40 facing away from the package substrate 22. As will become apparent, the recessed lateral portions 42 can facilitate aligning various components. The recessed lateral portions 42 extend, as recessed, to respective lateral boundaries of the ring stiffener 40. In other examples, the recessed lateral portions 42 can form, for example, respective channels proximate to lateral boundaries of the ring stiffener 40. In further examples, the ring stiffener 40 can have a uniform thickness and a flat surface, without recessed portions, distal from the package substrate 22, similar to what is shown in FIGS. 10 through 13 as described subsequently.

Further, the ring stiffener 40 extends laterally beyond the lateral edges of the package substrate 22. By having the ring stiffener 40 extend laterally beyond the package substrate 22, an area of the ring stiffener 40 to which an overlying component (e.g., a wedge 50 as will be described subsequently) can be increased. By increasing this contact area, heat transfer through this contact area in the thermally conductive path formed through the ring stiffener 40 can be increased.

Wedges 50 are disposed on the recessed lateral portions 42 of the ring stiffener 40. The wedges 50 are expandable to ensure physical contact with neighboring components. In the illustrated example, and as described more below, each wedge 50 includes a screw 52 that can be rotated to expand the wedge 50. In the examples described herein, each wedge 50 includes multiple components that are formed of, e.g., a metal or other material having a high thermal conductance. As will be described further below, the thermally conductive path through the ring stiffener 40 can further be formed through a respective wedge 50.

A heat sink 60 is disposed on the wedges 50 and on the package (e.g., on the IC die 24). The heat sink 60 includes a base plate 62 and a fin structure 64. The fin structure 64 is attached to the base plate 62 and includes fins that extend away from the base plate 62. The base plate 62 and fin structure 64 can be or include, e.g., a metal or other material having a high thermal conductance. For example, the base plate 62 and/or the fin structure 64 can be a material with a high thermal conductivity in its one, two, or three directions, like a metal, graphite, or the like. In some examples, the base plate 62 and the fin structure 64 are each a machined component formed of a metal. The fins of the fin structure 64 create a larger surface area on the heat sink 60 through which heat can be dissipated to a surrounding environment.

The base plate 62 has a first side that is proximate to the package (e.g., the IC die 24) and a second side that is distal from the package. The first side of the base plate 62 has a package protrusion 66 and wedge channels 70. The package protrusion 66 extends from the base plate 62 where the base plate 62 is proximate to the IC die 24 in the package. A TIM 68 is disposed between and adhered to the backside of the IC die 24 and to the package protrusion 66. The package protrusion 66 can extend a distance from the base plate 62 to provide clearance for components such as the ring stiffener 40 and/or the wedges 50. In some examples, the package protrusion 66 can be omitted. The TIM 68 provides a thermal coupling between the IC die 24 and the heat sink 60 (e.g., the base plate 62), which can form at least part of a thermally conductive path from the IC die 24 to the heat sink 60. The TIM 68 can be an organic material or an inorganic material, and such organic material may further be a mixture including thermally conductive particles.

The wedges 50 are disposed, at least partly, in the wedge channels 70 in the first side of the base plate 62. The wedge channels 70 can properly align the placement of the wedges 50, which can in turn properly align the ring stiffener 40 (e.g., if not adhered to the package substrate 22). The placement of the wedges 50 in the wedge channels 70 can cause respective sidewalls of the wedge channels 70 that are laterally interior in the base plate 62 to align with sidewalls of the ring stiffener 40 that are between the recessed lateral portions 42 and the inner portion 44 (e.g., sidewalls formed by steps between the recessed lateral portions 42 and the inner portion 44).

The second side of the base plate 62 has a heat pipe channel 72 in which heat pipes 74a, 74b, and 74c (collectively or individually "heat pipe(s) 74") are disposed. The heat pipes 74 can, through the phase change and transport of a fluid in the heat pipes 74, distribute thermal energy throughout the heat sink 60 for dissipation. The fin structure 64 is attached to the second side of the base plate 62, with the heat pipes 74 disposed in the heat pipe channel 72 between the base plate 62 and the fin structure 64.

The heat sink can have any other configuration. For example, the heat sink can include a vapor chamber in addition or as an alternative to the heat pipes. Further, micro channels can be implemented to permit fluid phase change for heat transfer in the heat sink. Heat pipes, a vapor chamber, and/or micro channels can be omitted in other examples. The base plate 62 can be integral to the fin structure 64. Still further, a remote heat exchanger can be implemented with or as the heat sink. A person having ordinary skill in the art will readily understand other modifications and configurations that may be made to the heat sink in other examples.

The thermally conductive path through the ring stiffener 40 and wedge 50 is to the heat sink 60 (e.g., the base plate 62). By the wedges 50 contacting the base plate 62 in the wedge channels 70, thermal energy conducted along the thermally conductive path can reach the base plate 62, be distributed through the heat sink 60 by the heat pipes 74, and be dissipated to a surrounding environment via the fin structure 64. Another thermally conductive path can be formed through the TIM 68 to the heat sink 60 (e.g., the base plate 62). Through the TIM 68, thermal energy conducted along the additional thermally conductive path can also reach the base plate 62, be distributed through the heat sink 60 by the heat pipes 74, and be dissipated to a surrounding environment via the fin structure 64.

A bracket 80 is on a side of the PCB 20 opposite from the package. Attachment mechanisms 82 are configured to attach to the base plate 62 of the heat sink 60 and to the bracket 80 through the PCB 20. In the illustrated example, each attachment mechanism 82 includes a threaded male portion that is screwed into a threaded hole in the base plate 62. Each attachment mechanism 82 further includes a pin portion that extends through holes through the PCB 20 and at least partially through the bracket 80. The pin portion includes a threaded hole into which a screw may be inserted. When the pin portion is inserted through a hole of the PCB 20 and at least partially through the bracket 80 and a screw is inserted into the threaded hole of the pin portion, the corresponding attachment mechanism 82 may secure the bracket 80 and any other component attached to the attachment mechanism 82 (such as the base plate 62) to the PCB 20.

Each attachment mechanism 82 further includes a wider body portion between the threaded male portion and the pin portion. The wider body portion can be too wide to extend into the hole in the PCB 20 and too wide to be inserted into the threaded hole in the base plate 62 into which the threaded male portion is screwed. Hence, the body portion can provide a standoff height between the PCB 20 and the base plate 62 of the heat sink 60. The bracket 80 with attachment mechanisms 82 can secure the heat sink 60 to the PCB 20 and may further properly align the heat sink 60 to the PCB 20.

Figure 2B:
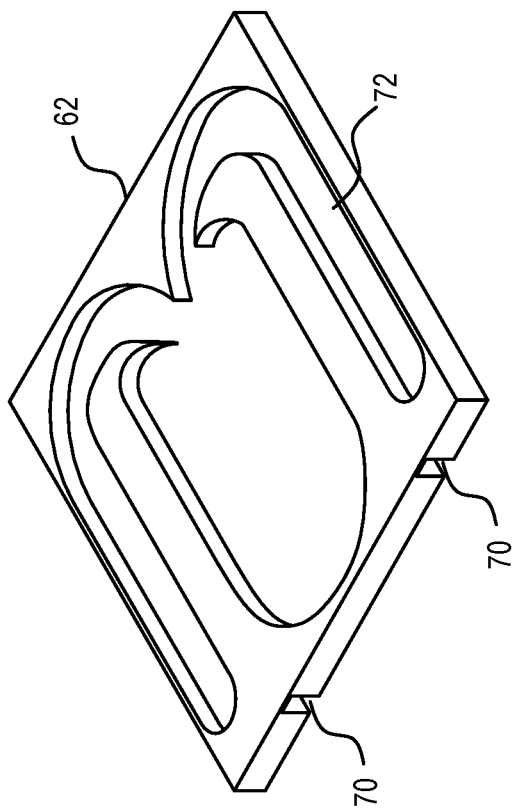
FIGS. 2A and 2B are perspective views of a base plate of a heat sink, according to some examples.
Figure 2A:
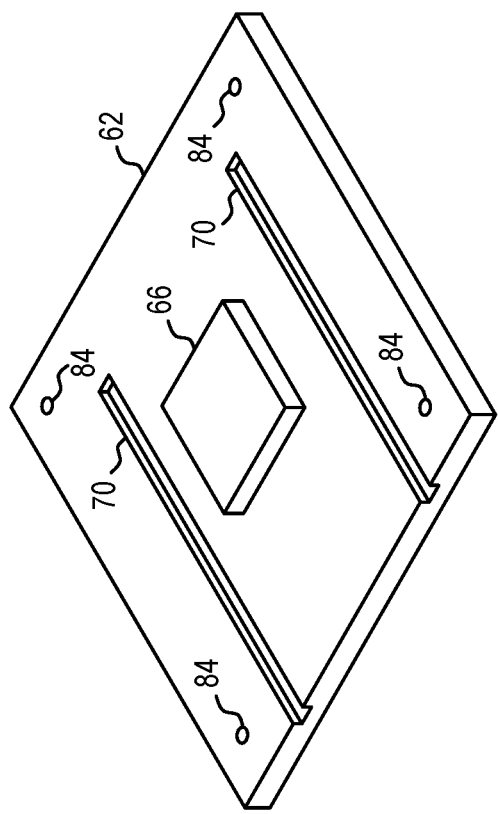

FIGS. 2A and 2B are perspective views of the base plate 62 of FIGS. 1A and 1B, according to some examples. FIG. 2A illustrates the first side of the base plate 62 (e.g., proximate to the package), and FIG. 2B illustrates the second side of the base plate 62 (e.g., distal from the package). FIG. 2A illustrates the package protrusion 66 extending from the first side of the base plate 62 and the wedge channels 70 in the first side of the base plate 62. The wedge channels 70, as illustrated, do not extend laterally fully through the first side of the base plate 62, and in other examples, the wedge channels 70 may extend laterally fully through the first side of the base plate 62. As stated previously, the package protrusion 66 may be omitted. The first side of the base plate 62 further has threaded holes 84 into which respective threaded male portions of the attachment mechanisms are inserted.

FIG. 2B illustrates the heat pipe channel 72 in the second side of the base plate 62. As illustrated, the portions of the heat pipe channel 72 in which the heat pipes 74a and 74c are disposed (refer to FIG. 1B) extend laterally bypassing the locations of the wedge channels 70. Hence, the heat pipe channel 72 and the wedge channels 70 do not intersect, and structural integrity of the base plate 62 may be maintained.

Figure 3:
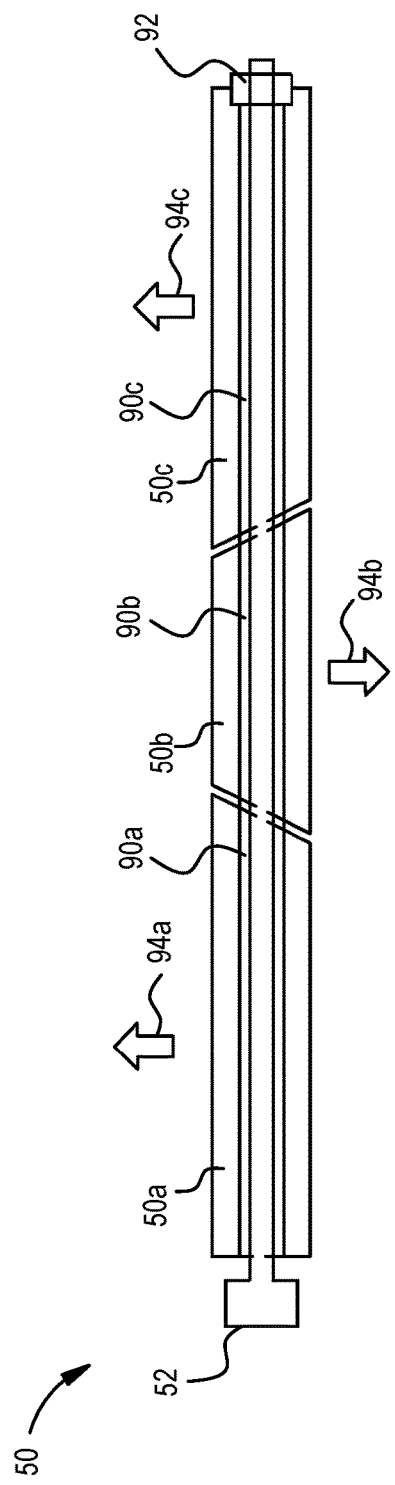
FIG. 3 is a cross-sectional view of a wedge, according to some examples.

FIG. 3 illustrates a cross-sectional view of a wedge 50, according to some examples. The wedge 50 includes three wedge portions 50a, 50b, and 50c. The wedge portions 50a, 50b, and 50c have respective openings 90a, 90b, and 90c therethrough. A shaft of the screw 52 is inserted through the openings 90a, 90b, and 90c, and a nut 92 is threaded onto the screw 52 with the wedge portions 50a, 50b, and 50c between the nut 92 and the screw head of the screw 52. The nut 92 can be embedded in a recess in the wedge portion 50c or may be sized relative to the wedge channel 70 such that the nut 92 does not rotate when the wedge 50 is inserted into the wedge channel 70 and the screw is rotated.

The wedge portions 50a, 50b, and 50c are configured such that, as the screw 52 is screwed into the nut 92 (and hence, a distance between the screw head and the nut 92 is reduced), the wedge portions 50a, 50b, and 50c collectively vertically expand. As illustrated, the wedge portions 50a, 50b, and 50c collectively vertically expand by wedge portions 50a and 50c moving in directions 94a and 94c, and wedge portion 50b moving in direction 94b, which is opposite from directions 94a and 94c. Cross-sections of the openings 90a, 90b, and 90c through which the shaft of the screw 52 is inserted are larger than the cross-section of the shaft of the screw 52 (such as by being elongated in the directions 94a, 94b, and 94c) to permit the movement of the wedge portions 50a, 50b, and 50c. In the illustrated cross-section of FIG. 3, the surfaces of the wedge portions 50a, 50b, and 50c that interface with a neighboring one of the wedge portions 50a, 50b, and 50c are angled with respect to the respective longitudinal axes of the openings 90a, 90b, and 90c and the shaft of the screw 52. These surfaces form opposing inclined planes on the wedge portions 50a, 50b, and 50c such that, when the screw 52 is screwed into the nut 92, the wedge portions 50a, 50b, and 50c are laterally compressed together, and the inclined planes formed by those surfaces cause the vertical expansion in directions 94a, 94b, and 94c. Additional wedge portions may be included in other examples. Other configurations may be implemented for a wedge in other examples.

Figure 4:
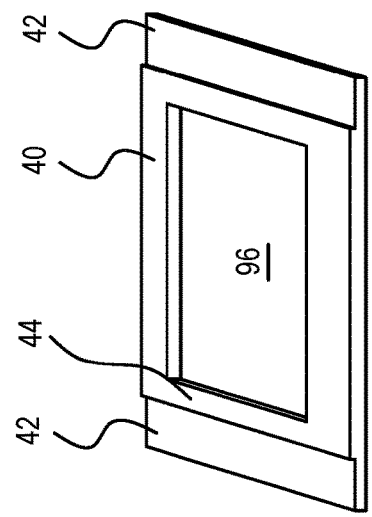
FIG. 4 is a perspective view of a ring stiffener, according to some examples.

FIG. 4 illustrates a perspective view of the ring stiffener 40, according to some examples. The ring stiffener 40 has recessed lateral portions 42 (on which the wedges 50 are disposed in FIG. 1A) and an inner portion 44. An opening 96 is through the ring stiffener 40 interior to the inner portion 44. The IC die 24 is disposed in the opening 96 in the illustration of FIG. 1A. A side of the ring stiffener 40 occluded by the perspective view of FIG. 4 (e.g., a bottom side) can be a flat surface or can be at least partially conformal to the package (e.g., the package substrate 22). For example, if the side of the ring stiffener 40 is at least partially conformal to the package, the ring stiffener 40 can contact the outer lateral portions of the surface of the package substrate 22 to which the IC die 24 is attached, can contact outer sidewalls of the package substrate 22, and can further contact a surface of the PCB 20 to which the package substrate 22 is attached. In the illustration of FIG. 1A, the side of the ring stiffener 40 is a flat surface. The ring stiffener 40 in the illustrated example can be machined from a single material, and can therefore be a single, integral component.

To assemble the apparatus illustrated in FIGS. 1A and 1B, and detailed further in FIGS. 2A through 4, after the package is formed, the package is attached to the PCB 20, such as by reflowing the external connectors 30. The package can have the ring stiffener 40 adhered to the package substrate 22 before the package is attached to the PCB 20 in some examples. The threaded male portions of the attachment mechanisms 82 are screwed into the threaded holes 84 of the base plate 62, which has the fin structure 64 attached (with the heat pipes 74 disposed between the base plate 62 and the fin structure 64). The TIM 68 is applied to the IC die 24 and/or the package protrusion 66. The heat sink 60, the ring stiffener 40 (if not previously attached to the package substrate 22), the PCB 20 (with the package thereon), and the bracket 80 are aligned. The pin portions of the attachment mechanisms 82 are inserted into respective holes through the PCB 20 and the bracket 80, and screws are inserted into the pin portions to secure the bracket 80 and heat sink 60 to the PCB 20. The wedges 50 are inserted into the wedge channels 70 in the base plate 62 and on the recessed lateral portions 42 of the ring stiffener 40. The screws 52 are then rotated to cause the wedges 50 to expand, which causes the wedges 50 to be in firm contact with the ring stiffener 40 and the base plate 62 and causes the ring stiffener 40 to be firmly pressed into contact with the ring contact area of the package substrate 22. The contact between the package substrate 22, the ring stiffener 40, the wedges 50, and the base plate 62 can provide thermally conductive paths to dissipate heat.

Figure 5:
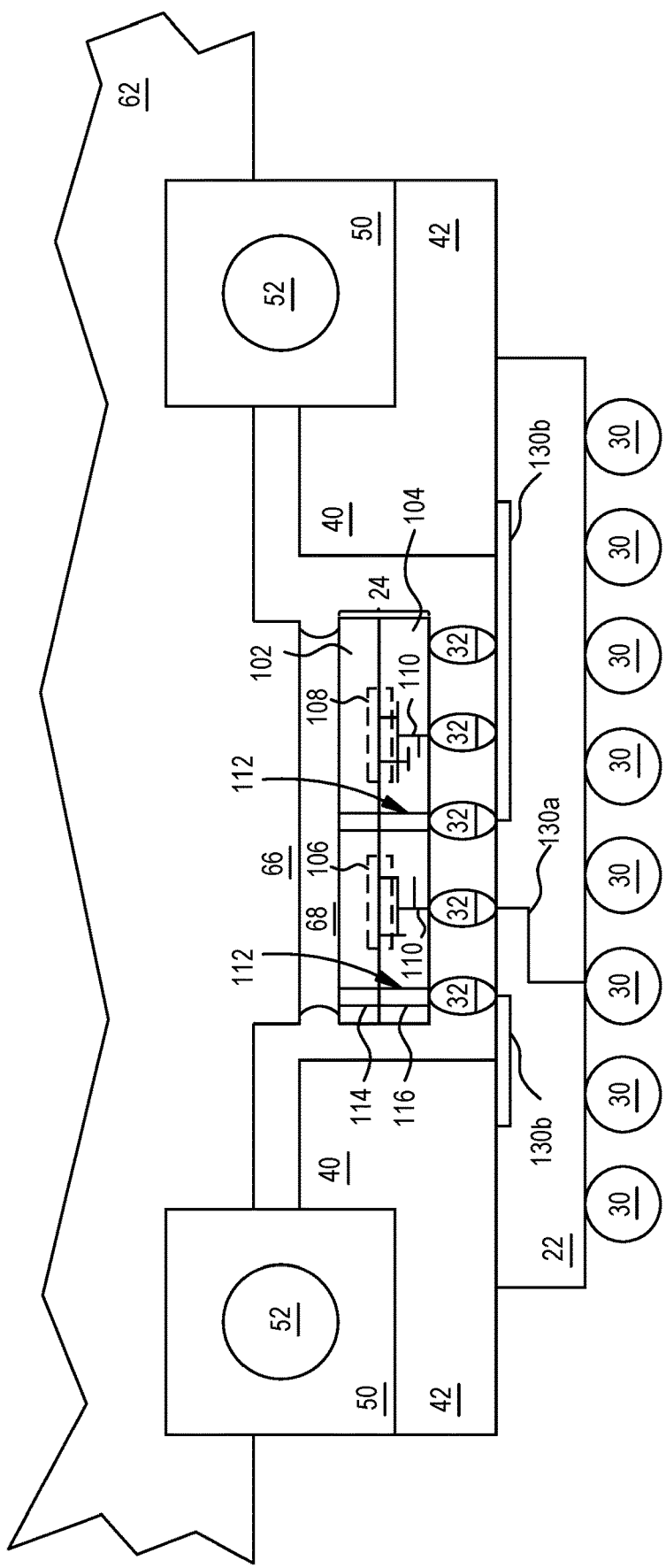
FIG. 5 is a partial cross-sectional view of the electronic device apparatus of FIG. 1A illustrating additional details, according to some examples.

FIG. 5 illustrates a partial cross-sectional view of the electronic device apparatus of FIG. 1A to illustrate additional details, according to some examples. The IC die 24 includes a semiconductor substrate portion 102 and an interconnect portion 104. The semiconductor substrate portion 102 includes a semiconductor material from, e.g., a wafer. First devices 106 (e.g., transistors, etc.) and second devices 108 (e.g., transistors, etc.) are formed in and/or on the semiconductor substrate portion 102. The interconnect portion 104 includes any number of dielectric layers (e.g., interlayer dielectric layers and/or intermetallization dielectric layers) with metallizations 110 (e.g., metal lines and/or vias) formed therein. The metallizations 110 in the interconnect portion 104 of the IC die 24 can electrically connect the first devices 106 to form a first circuit of the IC die 24 and can electrically connect the second devices 108 to form a second circuit of the IC die 24. In some examples, the first circuit can be a processor or other circuit that generates a significant amount of thermal energy during operation (e.g., by consuming a high amount of power), and the second circuit can be memory or other circuit that does not generate a significant amount of thermal energy during operation. In other examples, the second circuit can generate a significant amount of thermal energy, while the first circuit does not.

The IC die 24 includes one or more in-chip heat sinks 112. The in-chip heat sink 112 can provide a thermally conductive path to conduct thermal energy generated by the IC die 24 out of the IC die 24 for dissipation. The in-chip heat sink 112 includes through substrate vias (TSVs) 114 and metallizations 116 (which are formed in the interconnect portion 104 with the metallizations 110). The in-chip heat sink 112 laterally encircles the first devices 106 and the metallizations 110 that interconnect the first devices 106, which form the first circuit. Although not specifically illustrated, the interconnected metallization 110 (that is separate from the in-chip heat sink 112) may pass laterally through the in-chip heat sink 112 to electrically connect the first circuit and the second circuit.

The first and second circuits of the IC die 24 are each electrically connected by interconnected metallization 110 to contact pads on the frontside of the IC die 24. Further, the in-chip heat sink 112 is connected to contacts pads on the frontside of the IC die 24. Various ones of the external connectors 32 are electrically and mechanically connected to the contact pads on the frontside of the IC die 24, and thus, are connected to the interconnected metallization 110 and to the in-chip heat sink 112.

The external connectors 32 are further electrically and mechanically connected to contact pads in the die receiving area of the first side of the package substrate 22. The contact pads on the first side of the package substrate 22 are connected to metallization 130a and 130b (collectively, metallization 130) of the package substrate 22. The metallization 130 of the package substrate 22 may be disposed on the first side of the package substrate 22, within the package substrate 22, through the package substrate 22, and/or on the second side of the package substrate 22. The metallization 130 of the package substrate 22 may be or include metal lines, vias, through vias, and the like. As illustrated, the metallization 130a is electrically connected to a contact pad on the first side of the package substrate 22 that is connected to an external connector 32 electrically connected to the first circuit (or second circuit) of the IC die 24, and is also connected to a contact pad on the second side of the package substrate that is connected to an external connector 30. The metallization 130b is connected to a contact pad in the die receiving area of first side of the package substrate 22 that is connected to an external connector 32 connected to the in-chip heat sink 112 of the IC die 24, and is also connected to a contact pad in the ring contact area of the first side of the package substrate 22.

Metallization 130a therefore extends through the package substrate 22 and is electrically connected to contact pads disposed on the second side of the package substrate 22. The contact pads disposed on the second side of the package substrate 22 are electrically and mechanically connected, by external connectors 30, to contact pads on the PCB 20, as shown in FIG. 1A. The first circuit and/or second circuit of the IC die 24 can therefore be electrically connected to the PCB 20 via contact pads of the IC die 24, external connectors 32, contact pads in the die receiving area of the first side of the package substrate 22, metallization 130a, contact pads on the second side of the package substrate 22, and external connectors 30.

Metallization 130b of the package substrate 22 is routed to contact pads in the ring contact area of the first side of the package substrate 22 where the ring stiffener 40 is to contact the package substrate 22. When the ring stiffener 40 is placed on the package substrate 22, as depicted in FIGS. 1A and 5, the ring stiffener 40 contacts the contact pads in the ring contact area to which the metallization 130b is connected. The in-chip heat sink 112 is thermally coupled to the ring stiffener 40 via contact pads of the IC die 24, external connectors 32, contact pads in the die receiving area of the first side of the package substrate 22, metallization 130b, and contact pads in the ring contact area of the first side of the package substrate 22.

At least two thermally conductive paths are formed between the in-chip heat sink 112 and the heat sink 60 in the electronic device apparatus of FIGS. 1A and 5. The TIM 68 is adhered to and between the backside of the IC die 24 (and hence, to the in-chip heat sink 112 exposed through the backside of the IC die 24) and the base plate 62 of the heat sink 60. Hence, the TIM 68 thermally couples the in-chip heat sink 112 to the heat sink 60, and a first thermally conductive path is from the in-chip heat sink 112 through the TIM 68 to the heat sink 60. A second thermally conductive path is from the in-chip heat sink 112 through contact pads of the IC die 24, external connectors 32, contact pads in the die receiving area of the first side of the package substrate 22, metallization 130b, contact pads in the ring contact area on the first side of the package substrate 22, the ring stiffener 40, and the wedge 50 to the base plate 62 of the heat sink 60. The multiple thermally conductive paths may dissipate heat more efficiently.

As stated previously, the first circuit formed by the first devices 106 and corresponding interconnected metallization 110 can generate more thermal energy during operation than the second circuit formed by second devices 108 and corresponding interconnected metallization 110. For example, the first circuit may consume more power than the second circuit. To prevent or reduce lateral heat transfer from the first circuit to the second circuit, the in-chip heat sink 112 is disposed therebetween. The in-chip heat sink 112 is generally a thermally conductive wall that extends between a backside and a frontside of the IC die 24. In an example, the in-chip heat sink 112 forms part of a thermally conductive path that is exposed through the backside of the IC die 24. In another example, the in-chip heat sink 112 forms part of a thermally conductive path that is exposed through the frontside of the IC die 24. In other embodiments, the in-chip heat sink 112 extends from the frontside to the backside of the IC die 24, thus providing a bi-directional heat transfer path from the interior regions of the IC die 24 to exterior surfaces of the IC die 24. The thermally conductive path can be highly conductive relative to the thermal energy moving through, e.g., the dielectric materials of the IC die 24.

It should be noted that since the in-chip heat sink 112 provides a thermally conductive path to one or more exterior surfaces of the IC die 24, the in-chip heat sink 112 may also be beneficially utilized with circuits having the same or similar power consumption so that the maximum operating temperature of the IC die is not exceeded.

Figure 6:
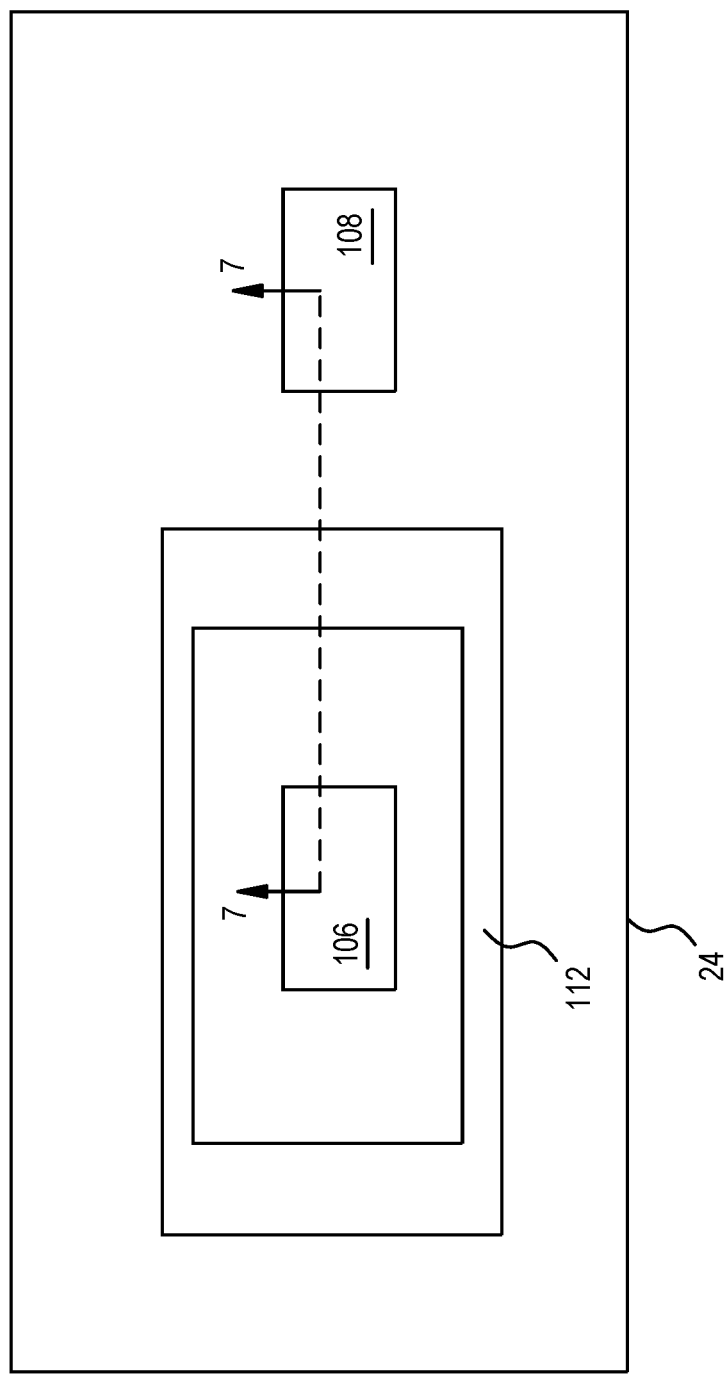
FIG. 6 is a simplified plan view of an integrated circuit (IC) die, according to some examples.

FIG. 6 is a simplified plan view of the IC die 24, according to some examples. As described above, the in-chip heat sink 112 is disposed laterally between the first devices 106 of the first circuit and the second devices 108 of the second circuit. Further, the in-chip heat sink 112 laterally surrounds or encircles the first devices 106 of the first circuit. Thus, the in-chip heat sink 112 can provide a thermal barrier that reduces the thermal contamination, e.g., of the second circuit by thermal energy generated by the first circuit, or vice versa. Although the in-chip heat sink 112 is shown separating the first circuit from the second circuit, the in-chip heat sink 112 may separate one or more circuits from one or more other circuits. It is also contemplated that more than one in-chip heat sink 112 may be utilized in a single IC die.

The in-chip heat sink 112 may simply be a wall disposed laterally between the first devices 106 of the first circuit and the second devices 108 of the second circuit, or may partially or completely laterally surround the first devices 106 of the first circuit. In the example depicted in FIG. 6, the in-chip heat sink 112 has a ring shape that completely laterally surrounds the first devices 106 of the first circuit. In other examples, the in-chip heat sink 112 may discontinuously surround the first devices 106 of the first circuit, for example, but leaving space of the metallization 110 to be routed through the in-chip heat sink 112 without shorting. In yet other embodiments, the in-chip heat sink 112 may be coupled to power or ground circuitry within the IC die 24. In other examples, the in-chip heat sink 112 is floating relative to the power and ground, and is isolated from the signal transmission paths connected to the first circuit and/or the second circuit.

Although the plan view of in-chip heat sink 112 in FIG. 6 is rectangular, having four straight (e.g., linear) sides, the in-chip heat sink 112 may have other configurations, including other polygonal shapes, irregular shapes, or other desired shape.

Figure 7:
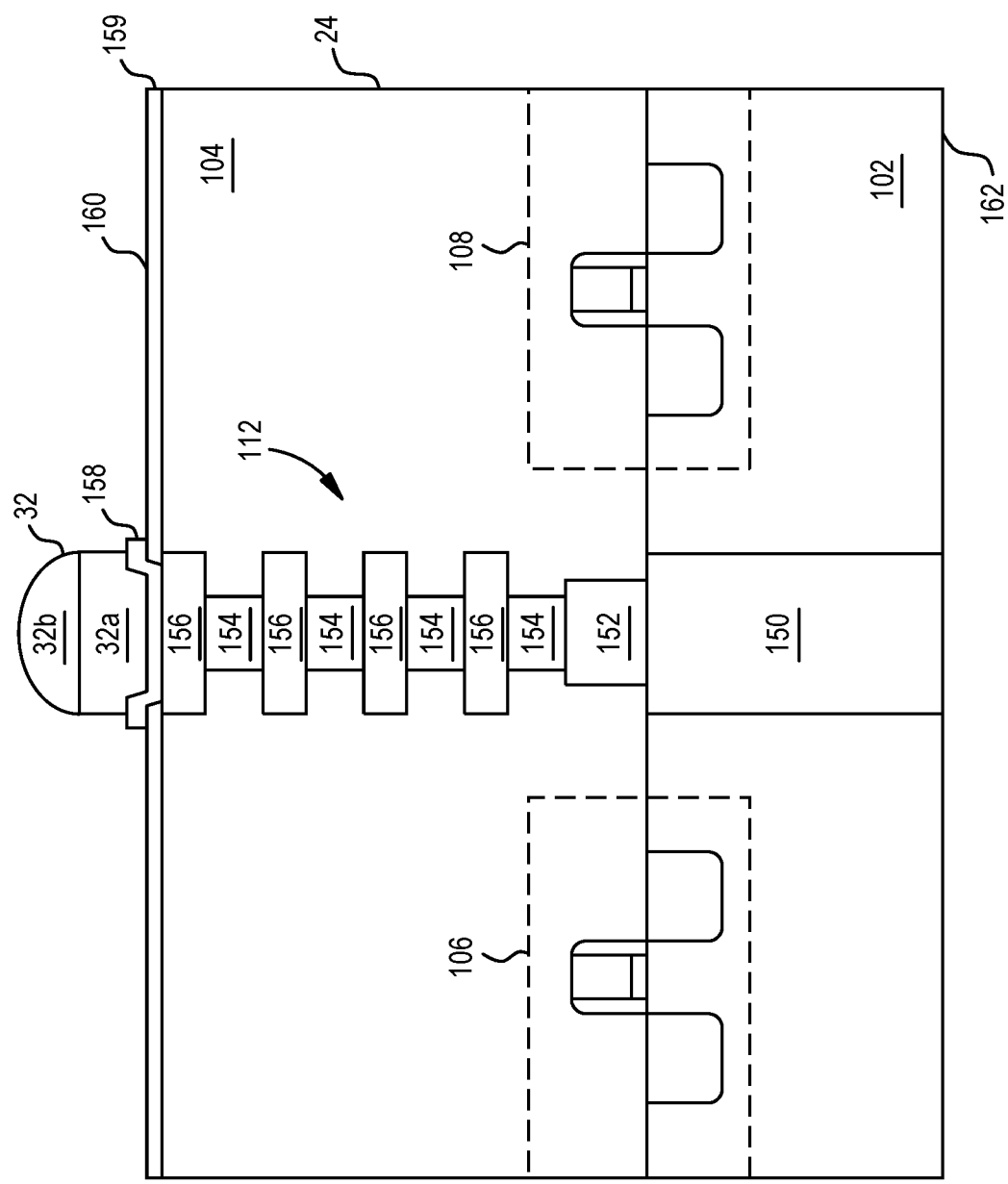
FIG. 7 is a partial simplified cross-sectional view of the IC die of FIG. 6, according to some examples.

FIG. 7 is a partial simplified cross-sectional view of the IC die 24 taken along section line 7-7 depicted in FIG. 6, according to some examples. The in-chip heat sink 112 is illustrated in FIG. 7 extending between the frontside exterior surface 160 and the backside exterior surface 162 of the IC die 24, with ends of the in-chip heat sink 112 being exposed at the exterior surfaces 160, 162 of the IC die 24. For simplification, the IC die 24 in FIG. 7 is illustrated before being attached to the package substrate 22, such as the IC die 24 may appear upon singulation from the wafer in which it was formed.

The in-chip heat sink 112 generally includes through substrate vias (TSVs) 150, contacts 152, vias 154, and lines 156 forming a thermally conductive wall within the IC die 24. The TSVs 150 extend through the semiconductor substrate portion 102 of the IC die 24 and are exposed through the backside exterior surface 162. The contacts 152 through a lower dielectric layer (e.g., interlayer dielectric layer) and contact respective TSVs 150. A via 154 and a line 156 are disposed in one or more dielectric layer (e.g., intermetallization dielectric layer). Each via 154 contacts an immediately underlying feature (e.g., contact 152 or line 156) and an immediately overlying line 156. Any number of vias 154, lines 156, and dielectric layers may be implemented within the in-chip heat sink 112 and/or the interconnect portion 104. A contact pad 158 (e.g., an under bump metallization (UBM)) contacts an uppermost line 156 exposed through a passivation layer 159 at the frontside exterior surface 160. An external connector 32 (e.g., a copper pillar 32a with solder 32b thereon) is on the contact pad 158.

The contacts 152, vias 154, and lines 156 forming at least part of the in-chip heat sink 112 are generally formed by the metal layers in the interconnect portion 104 of the IC die 24. Similarly, the TSVs 150 forming at least part of the in-chip heat sink 112 are generally formed of metal through the semiconductor substrate portion 102 of the IC die 24. Thus, the in-chip heat sink 112 may be fabricated from one or more of aluminum, copper, tungsten, titanium, tantalum, or other suitable metal or similarly thermally conductive material.

The backside exterior surface 162 (including the exposed TSVs 150) is adhered to the TIM 68 in FIGS. 1A and 5. Hence, a first thermally conductive path may be through the TSVs 150 and TIM 68 to the base plate 62 of the heat sink 60. The external connector 32 of FIG. 7 is connected to a contact pad in the die receiving area of the first side of the package substrate 22, which is further connected to the metallization 130b, as shown in FIG. 5. Hence, a second thermally conductive path may be through at least some of the vias 154, lines 156, contact pad 158, external connector 32, the contact pad in the die receiving area of the first side of the package substrate 22, metallization 130b, contact pad in the ring contact area of the first side of the package substrate 22, ring stiffener 40, and wedge 50 to the base plate 62 of the heat sink 60.

FIG. 7 further illustrates a first device 106 (e.g., a field effect transistor (FET)) of the first circuit and a second device 108 (e.g., a FET) of the second circuit. Additional devices, not explicitly illustrated, can be included in the first circuit and in the second circuit. The interconnected metallizations 110 of the first circuit and the second circuit are omitted from FIG. 7 to avoid obscuring other features. As illustrated, the in-chip heat sink 112 is disposed laterally between the first devices 106 of the first circuit and the second devices 108 of the second circuit.

In operation, thermal energy generated by the first circuit may be prevented from reaching the second circuit because the thermal energy can be conducted through the in-chip heat sink 112 to one or both of the exterior surfaces 160, 162 of the IC die 24. Thus, the in-chip heat sink 112 can enable better thermal control of the circuits of the IC die 24. This can result in the ability to utilize more powerful circuits within the IC die 24 without overheating or diminishing performance.

Figure 8:
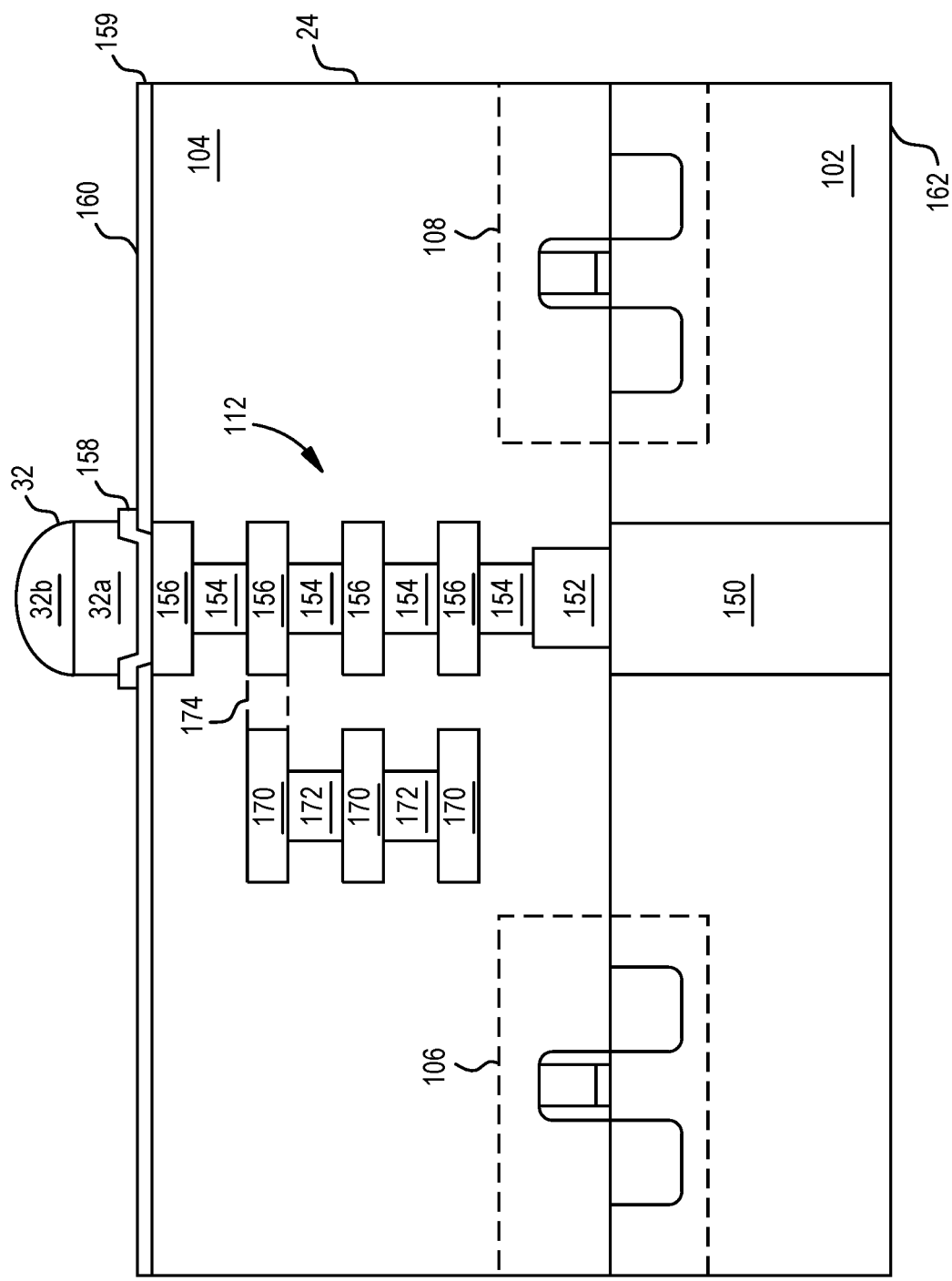
FIG. 8 is a partial simplified cross-sectional view of an IC die as a modification to FIG. 7, according to some examples.

FIG. 8 is a partial simplified cross-sectional view of the IC die 24 as a modification to FIG. 7, according to some examples. FIG. 8 illustrates a portion of an in-chip heat sink 112 disposed adjacent to dummy islands 170. The dummy islands 170 are not coupled to the first circuit or to the second circuit. The dummy islands 170 are distributed within the IC die 24 to provide a balance of metal needed to obtain sufficient planarization and tolerance control between layers. To improve heat transfer within the IC die 24, the dummy islands 170 are connected by vias 172. The dummy islands 170 and vias 172 can provide a thermally conductive path to transfer thermal energy away from the first circuit and towards at least one of the exterior surfaces 160, 162 of the IC die 24. Although the dummy islands 170 interconnected by vias 172 are illustrated in FIG. 8 on the same side of the in-chip heat sink 112 as the first circuit, dummy islands 170 interconnected by vias 172 may also be present, as an alternative or in addition to, on the second circuit side of the in-chip heat sink 112.

The heat transfer characteristics of the dummy islands 170 interconnected by vias 172 may be enhanced by coupling one or more of the dummy islands 170 to the in-chip heat sink 112 by a bridge 174 (shown in phantom). In this configuration, the thermal energy transferred by the dummy islands 170 can be transferred away from the first circuit to the in-chip heat sink 112, where the thermal energy can further be conducted to the exterior surfaces 160, 162 of the IC die 24. The dummy islands 170 can also improve thermal energy removal by conducting thermal energy laterally from the first circuit to the in-chip heat sink 112 more efficiently than what may occur through the dielectric material of the interconnect portion 104 of the IC die 24. In some examples, the dummy islands 170 may not be interconnected by vias 172, but rather one or more of the dummy islands 170 may be directly connected to the in-chip heat sink 112.

Figure 9:
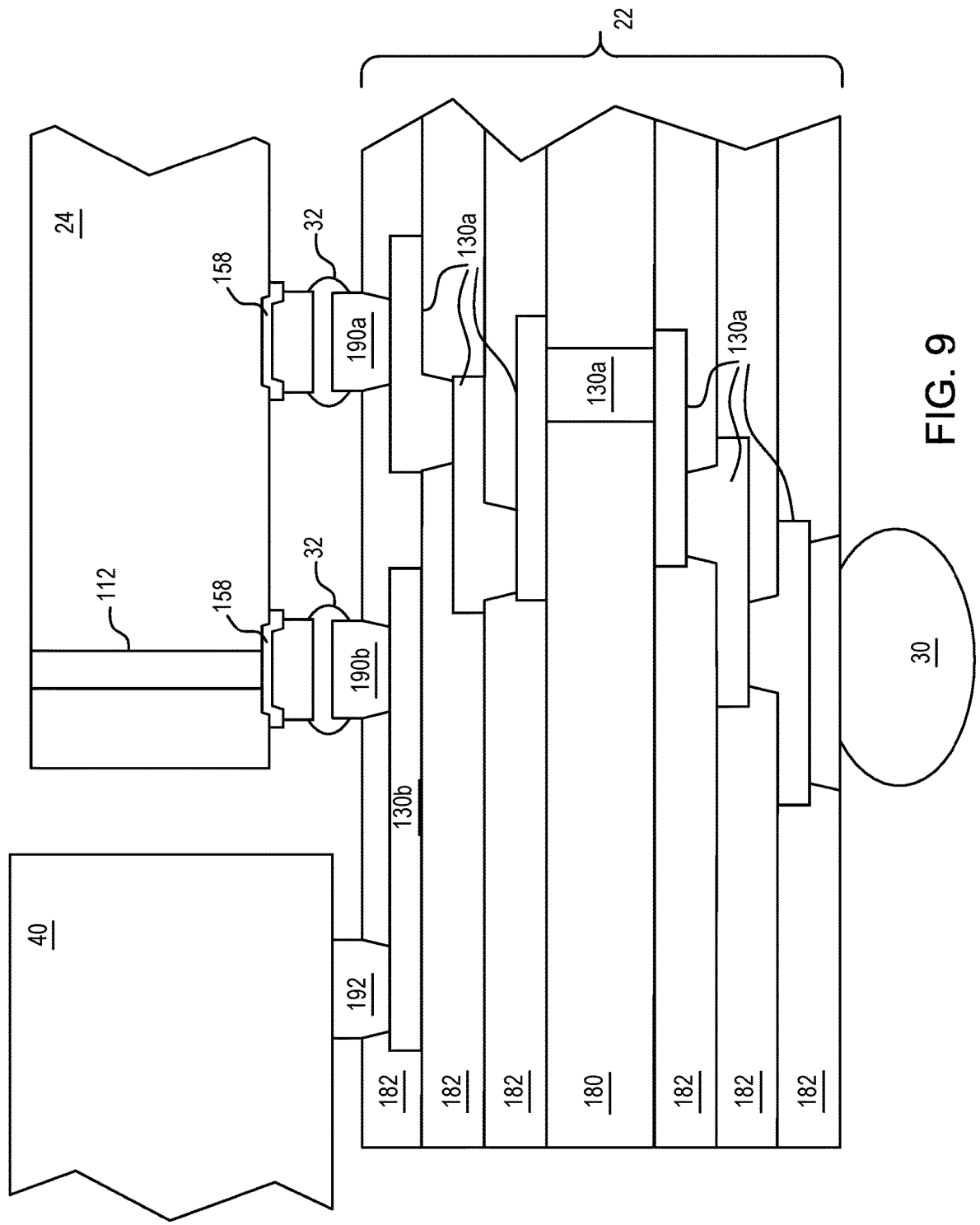
FIG. 9 is a partial cross-sectional view of the electronic device apparatus of FIG. 1A illustrating additional details, according to some examples.

FIG. 9 is a partial simplified cross-sectional view of the electronic device apparatus to illustrate additional details of the package substrate 22, according to some examples. The package substrate 22 includes a core 180 and dielectric layers 182. Dielectric layers 182 are on both sides of the core 180. In some examples, the package substrate can be coreless. The metallization 130 is in and/or on the dielectric layers 182 (e.g., as lines and vias) and through the core 180 (e.g., as through vias). The package substrate 22 further includes contact pads 190a, 190b, and 192 on the first side of the package substrate 22. The contact pads 190a, 190b (collectively, contact pads 190) are in the die receiving area of the first side of the package substrate 22. The contact pads 192 are in the ring contact area of the first side of the package substrate. As illustrated, the external connectors 32 are attached to the contact pads 158 of the IC die 24 and the contact pads 190 in the die receiving area of the first side of the package substrate 22. Further, the ring stiffener 40 contacts the contact pad 192 in the ring contact area of the first side of the package substrate 22.

Metallization 130a is routed through the package substrate 22 from the first side to the second side of the package substrate 22. The first and/or second circuit of the IC die 24 can be electrically connected to the external connector 30 on the second side of the package substrate 22, as illustrated, via the contact pad 158 on the IC die 24, external connector 32, contact pad 190a in the die receiving area, and metallization 130a.

Metallization 130b is routed through and/or on the package substrate 22 from the die receiving area to the ring contact area. The metallization 130b can be disposed in, on, and/or through any dielectric layer 182 or combination of dielectric layers 182, for example. As illustrated, the metallization 130b is in the outermost dielectric layer 182 on the first side of the package substrate 22. The metallization 130b is connected to a contact pad 190b in the die receiving area that is connected to an external connector 32 and corresponding contact pad 158 of the IC die 24 that is further connected to the in-chip heat sink 112. The metallization 130b is further connected to a contact pad 192 in the ring contact area that the ring stiffener 40 contacts. In some examples, the metallization 130b may be on the exterior surface of the outermost dielectric layer 182 and be integral with the contact pads 190b, 192 to which it is connected. As previously indicated, an adhesive, like TIM, may be used to adhere the ring stiffener 40 to the package substrate 22. Hence, such an adhesive may, in some examples, be disposed between the ring stiffener 40 and the contact pad 192 and/or ring contact area of the package substrate 22. Other modifications may be implemented.

As illustrated, a thermally conductive path is formed from the IC die 24 (e.g., via the in-chip heat sink 112) through the contact pad 158, external connector 32, contact pad 190b, metallization 130b, contact pad 192, and ring stiffener 40.

Although various components illustrated in the figures and described herein may be illustrated and described as being in direct contact, in some examples, such components may be, for example, connected or coupled to each other by an adhesive. For example, an adhesive, such as a TIM, may be between and thermally coupling the ring stiffener 40 and the package substrate 22 (e.g., including between the contact pads 192 and the ring stiffener 40). Further, for example, an adhesive, such as a TIM, may be between and thermally coupling the wedges 50 to the ring stiffener 40 and/or to the base plate 62 of the heat sink 60.

Figure 10:
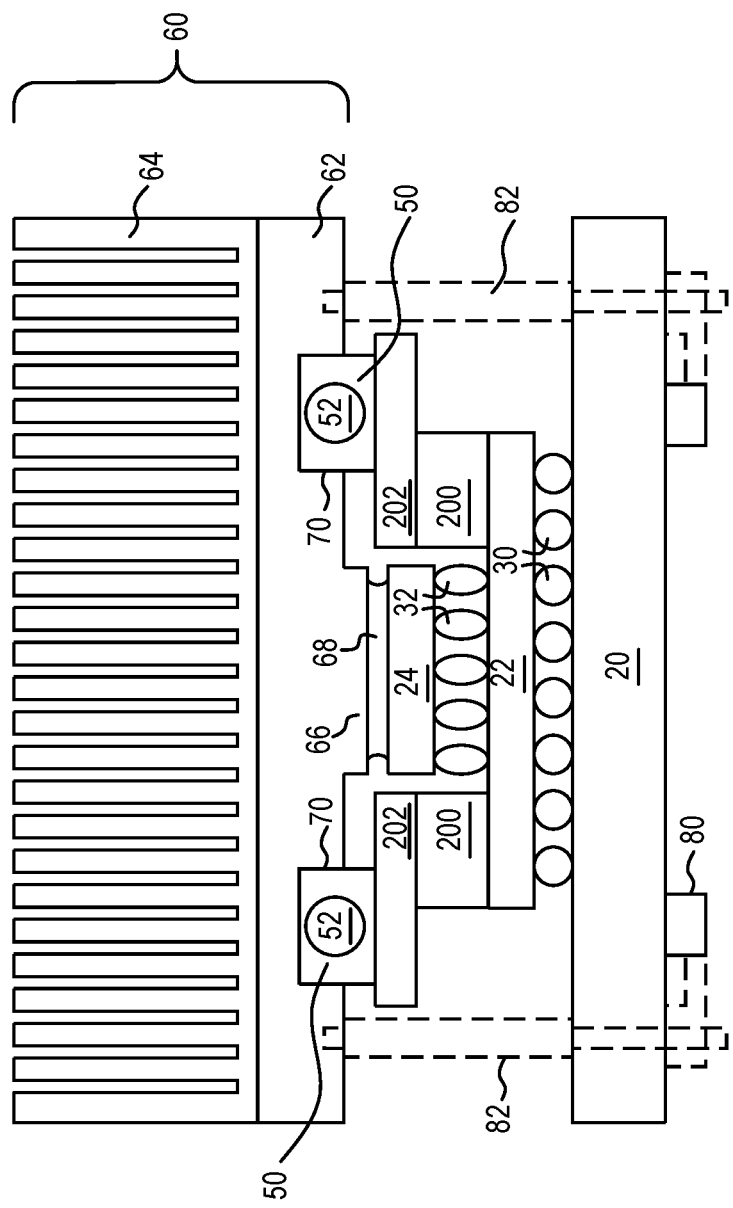
FIG. 10 is a cross-sectional view of another electronic device apparatus, according to some examples.

FIG. 10 illustrates a cross-sectional view of an electronic device apparatus, according to some examples. The electronic device apparatus of FIG. 10 includes many of the same or similar components as illustrated in and described with respect to FIGS. 1A and 1B and subsequent figures. Additional description of those components is omitted here, although a person having ordinary skill in the art will readily understand the presence of such components, and any modifications, as incorporated into the electronic device apparatus of FIG. 10.

The electronic device apparatus of FIG. 10 includes a package that includes a multi-component (e.g., dual-component) ring stiffener. The multi-component ring stiffener is disposed on the package substrate 22 and around the IC die 24. The multi-component ring stiffener includes a lower ring stiffener 200 and an upper ring stiffener 202. The lower ring stiffener 200 contacts or is attached to a ring contact area of the first side of the package substrate 22, for example. The ring contact area, and hence, the lower ring stiffener 200, can be laterally exterior to, and may further surround, the die receiving area of the first side of the package substrate. The lower ring stiffener 200 is illustrated having outer lateral edges that are co-extensive with the outer lateral edges of the package substrate 22. In some examples, the lower ring stiffener 200 can have outer lateral edges that are laterally interior to the outer lateral edges of the package substrate 22 (e.g., the lower ring stiffener 200 can be laterally smaller than the package substrate 22). According to some examples, and as will be detailed subsequently, the lower ring stiffener 200 can be attached to the package substrate 22 without prohibiting or impeding use of typical or standard carriers, testing equipment, or other equipment. Accordingly, in some examples, the lower ring stiffener 200 generally does not extend beyond outer edges of the package substrate 22, although the lower ring stiffener 200 may, in some situations, extend beyond some outer edges of the package substrate 22 due to, for example, manufacturing tolerances, misalignment of the lower ring stiffener 200 to the package substrate 22, or other reason.

The upper ring stiffener 202 is disposed on and attached to the lower ring stiffener 200. The upper ring stiffener 202 likewise can be laterally exterior to, and may further surround, the die receiving area of the first side of the package substrate 22. The upper ring stiffener 202 extends laterally beyond the lower ring stiffener 200 and the package substrate 22. Hence, the upper ring stiffener 202 has outer lateral edges that are located some distance away from the corresponding lateral edges of the lower ring stiffener 200 and package substrate 22. By having the upper ring stiffener 202 extend laterally beyond the package substrate 22, an area of the multi-component ring stiffener to which an overlying component (e.g., a wedge 50 as will be described subsequently) can contact can be increased. By increasing this contact area, heat transfer through this contact area in the thermally conductive path formed through the multi-component ring stiffener can be increased.

The lower ring stiffener 200 can be flat on a side that contacts or is attached to the ring contact area on the first side of the package substrate 22. The upper ring stiffener 202, as illustrated, is flat on a side facing away from the package substrate 22 (e.g., that the wedges 50 contact). In other examples, the upper ring stiffener 202 can have recessed lateral portions laterally exterior to an inner portion on a side facing away from the package substrate 22, like the ring stiffener 40.

The heights or thicknesses of the lower ring stiffener 200 and the upper ring stiffener 202 can vary based on the components incorporated in the electronic device apparatus. As illustrated, the height of the lower ring stiffener 200 from the first side of the package substrate 22 is equal to the height of the backside of the IC die 24 from the first side of the package substrate 22. In other examples, these heights can be different.

The multi-component ring stiffener (including lower ring stiffener 200 and upper ring stiffener 202) can be formed of, e.g., a metal that has mechanical strength to provide additional structural integrity and that is capable of conducting thermal energy. As will be described further below, a thermally conductive path can be formed through the multi-component ring stiffener.

Wedges 50 are disposed on the flat side of the upper ring stiffener 202, or in other examples, recessed surface of the upper ring stiffener 202. A heat sink 60 is disposed on the wedges 50 and on the package (e.g., on the IC die 24).

Like in foregoing examples, a thermally conductive path is from the IC die 24 through the package substrate 22, multi-component ring stiffener (including lower ring stiffener 200 and upper ring stiffener 202), and wedge 50 to the heat sink 60 (e.g., the base plate 62). Further, another thermally conductive path can be formed through the TIM 68 to the heat sink 60 (e.g., the base plate 62).

Figure 11:
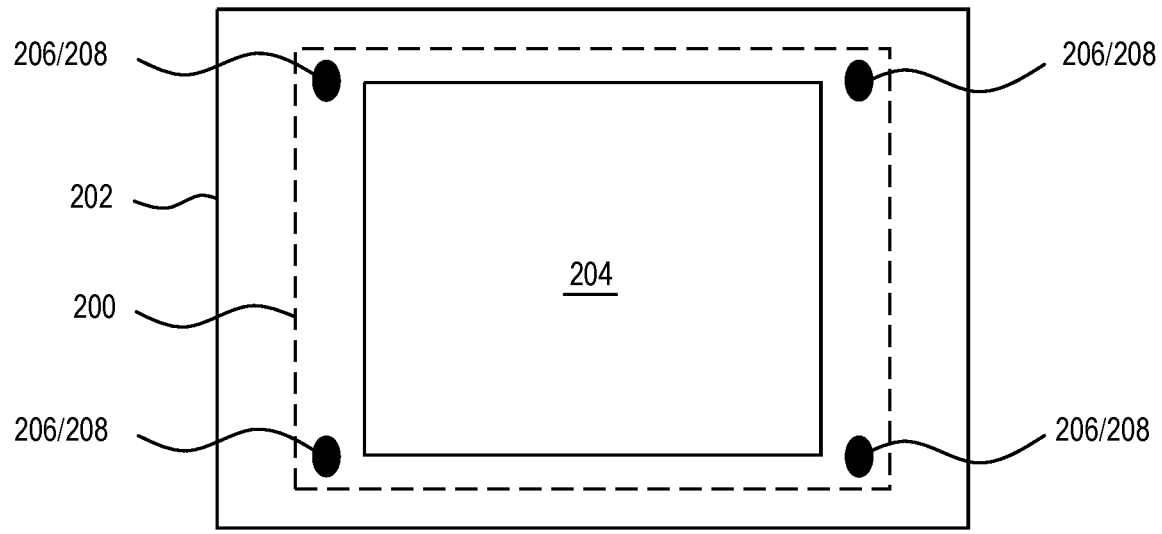
FIGS. 11, 12, and 13 are a top view, exploded cross-sectional view, and assembled cross-sectional view, respectively, of a multi-component ring stiffener, according to some examples.
Figure 12:
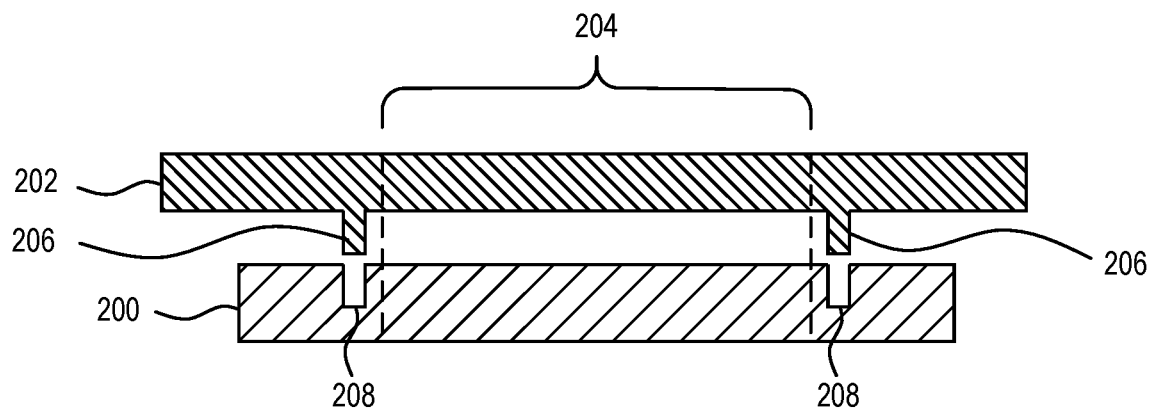
Figure 13:
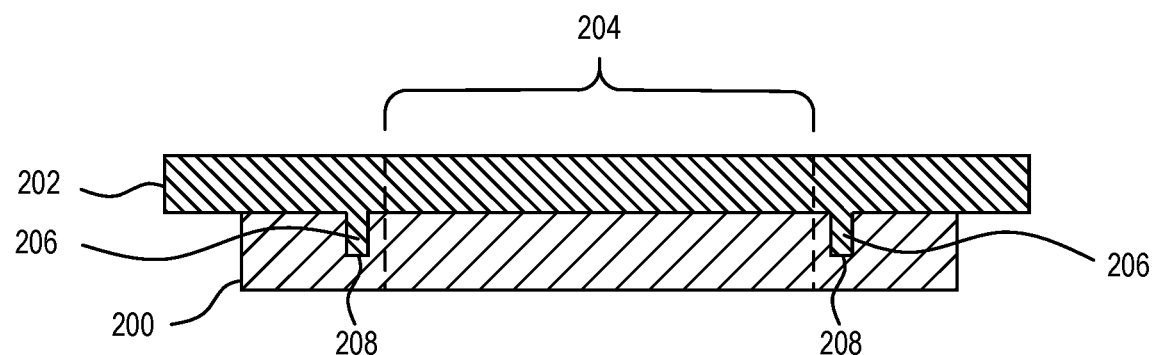

FIGS. 11, 12, and 13 illustrate a top view, exploded cross-sectional view, and assembled cross-sectional view, respectively, of the multi-component ring stiffener according to some examples. FIG. 11 shows an opening 204 that the inner lateral edges of the lower ring stiffener 200 and upper ring stiffener 202 define. The inner lateral edges of the upper ring stiffener 202 may align with the corresponding inner lateral edges of the lower ring stiffener 200. In the electronic device apparatus of FIG. 10, the IC die 24 is disposed in the opening 204. As shown in the top view in FIG. 11, the upper ring stiffener 202 extends laterally beyond the outer lateral edges of the lower ring stiffener 200.

The multi-component ring stiffener includes alignment pins 206 and alignment holes 208. In the illustrated example, an alignment pin 206 and alignment hole 208 is at each corner of the lower ring stiffener 200. The alignment pins 206 extend from a bottom surface of the upper ring stiffener 202, and the alignment holes 208 are through an upper surface of the lower ring stiffener 200. The alignment pins 206 are configured to mate with respective alignment holes 208 to align the upper ring stiffener 202 with the lower ring stiffener 200 when the upper ring stiffener 202 is joined to the lower ring stiffener 200, such as shown in FIG. 13. The alignment pins 206 and upper ring stiffener 202 can be machined from a singular material to form an integral component. Similarly, the alignment holes 208 can be machined out of the lower ring stiffener 200. In examples, the alignment pins 206 and corresponding alignment holes 208 can be at any location at the interface between the lower ring stiffener 200 and upper ring stiffener 202. Further, any number of alignment pins 206 and corresponding alignment holes 208 can be implemented in the lower ring stiffener 200 and upper ring stiffener 202. Additionally, in other examples, alignment pins may extend from the lower ring stiffener 200, and alignment holes can be in the upper ring stiffener 202. Any combination of alignment pins and alignment holes can be in each of the lower ring stiffener 200 and upper ring stiffener 202. In still further examples, the alignment pins and alignment holes can be omitted and/or other alignment mechanisms between the lower ring stiffener 200 and upper ring stiffener 202 can be implemented.

Although not illustrated in the figures, an adhesive may be implemented between the lower ring stiffener 200 and the upper ring stiffener 202. The adhesive can be implemented to securely join the upper ring stiffener 202 to the lower ring stiffener 200. A TIM can be used as the adhesive to permit thermal conductivity from the lower ring stiffener 200 to the upper ring stiffener 202.

Figure 14:
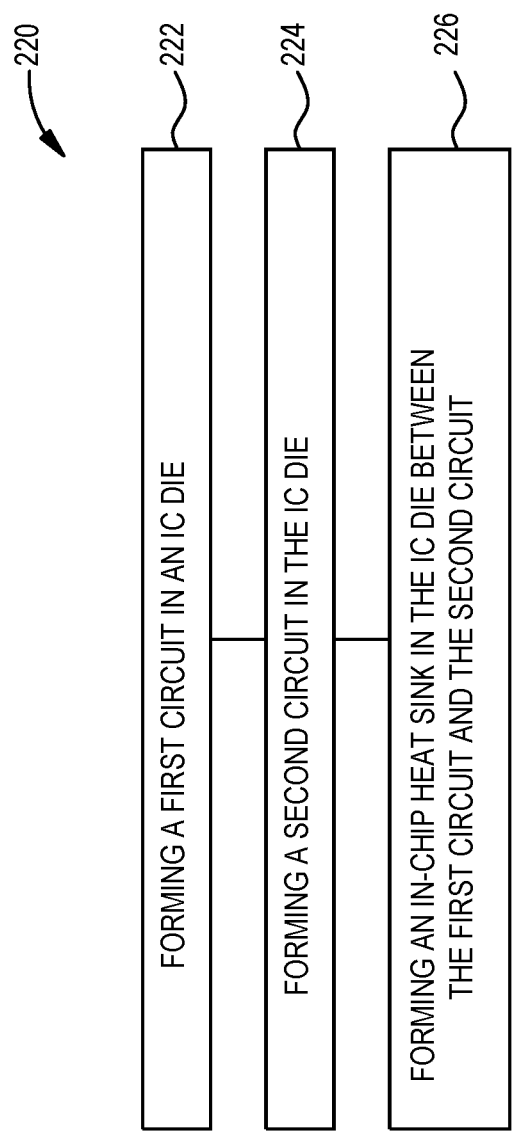
FIG. 14 is flow diagram of a method for fabricating an IC die having an in-chip heat sink, according to some examples.

FIG. 14 is flow diagram of a method 220 for fabricating an IC die having an in-chip heat sink, such as the IC die 24 and the in-chip heat sink 112 described above. The method 220 begins at operation 222 by forming a first circuit (e.g., including first devices 106) in an IC die 24. The first circuit may be formed by performing various semiconductor fabrication processes, including etching, deposition, implantation, etc., to form the first devices 106 and the interconnected metallization 110 of the first circuit. The first circuit may be configured as a processor or other circuitry.

At operation 224, a second circuit (e.g., including second devices 108) is formed in the IC die 24. The second circuit may be formed by performing various semiconductor fabrication processes, including etching, deposition, implantation, etc., to form the second devices 108 and the interconnected metallization 110 of the second circuit. The first circuit may generate more heat in operation than the second circuit. For example, the second circuit may be configured as a memory or other circuit that draws less power during operation than the first circuit.

At operation 226, an in-chip heat sink 112 is formed in the IC die 24 between the first devices 106 of the first circuit and the second devices 108 of the second circuit. The in-chip heat sink 112 is formed between the frontside exterior surface 160 and the backside exterior surface 162 of the IC die 24, as described above. The in-chip heat sink 112 may be formed by performing various semiconductor fabrication processes, including etching, deposition, implantation, etc., to form the TSVs 150, contacts 152, vias 154, and lines 156 of the in-chip heat sink 112.

Although illustrated as separate operations, various processing in the performance of operations 222, 224, and 226 may be performed simultaneously and/or sequentially.

Figure 15:
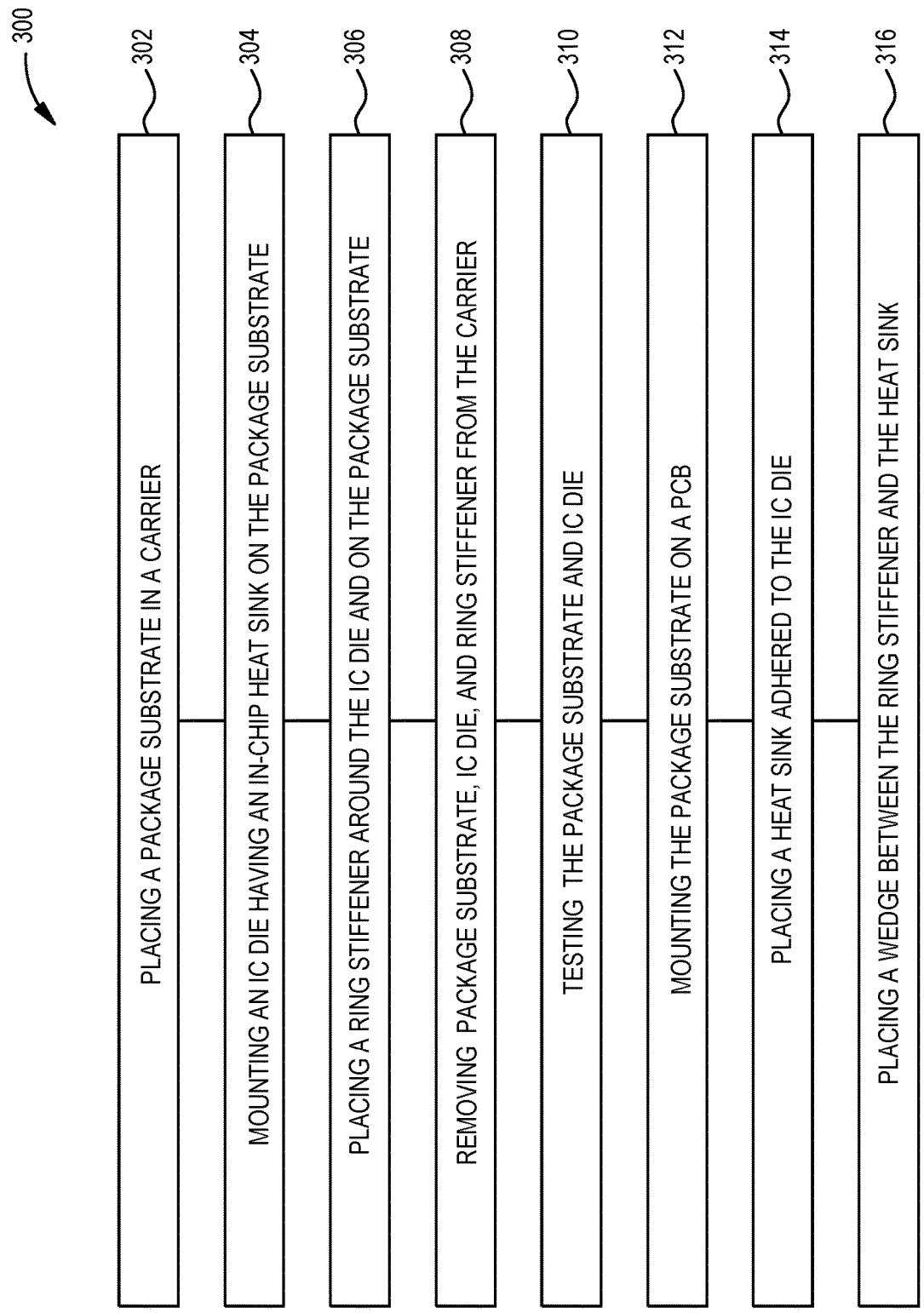
FIG. 15 is flow diagram of a method for fabricating an electronic device apparatus, according to some examples.

FIG. 15 is flow diagram of a method 300 for fabricating an electronic device apparatus, according to some examples. At operation 302, a package substrate 22 is placed in a carrier. The carrier can include a frame with openings into which respective package substrates are placed. The frame and openings can be configured to accommodate the components to be attached to the package substrate 22 while the package substrate 22 is on the carrier. For example, if the ring stiffener 40 is to be attached to the package substrate 22 while the package substrate 22 is on the carrier, the frame and openings may be sized to accommodate the lateral extension of the ring stiffener 40 beyond the lateral edges of the package substrate 22.

In operation 304, an IC die 24 having an in-chip heat sink 112 is mounted on the package substrate 22. The IC die 24 may be mounted on the package substrate 22 using external connectors 32 (e.g., including solder, which may be reflowed to mount the IC die 24 on the package substrate 22). As discussed above, the in-chip heat sink 112 extends between the backside exterior surface 162 and the frontside exterior surface 160 of the IC die 24. As also discussed above, the package substrate 22 includes metallization 130*b* that connects a contact pad 190*b* to which an external connector 32 is attached to a contact pad 192 in a ring contact area.

At operation 306, a ring stiffener 40 is placed around the IC die 24 and on the package substrate 22. The ring stiffener 40 can be adhered to the package substrate 22 using an appropriate adhesive, such as a TIM, between the ring stiffener 40 and the package substrate 22. At operation 308, the package substrate 22, IC die 24, and ring stiffener 40 are removed from the carrier. At operation 310, the package substrate 22 and IC die 24 are tested, such as by probing external connectors 30 on the second side of the package substrate 22. The testing can ensure proper functionality of the IC die 24 and package substrate 22, which may further test the external connectors 32 used to mount the IC die 24 to the package substrate 22. The testing may probe external connectors 30 after the external connectors 30 are formed on the package substrate 22, and/or may probe pads on which the external connectors 30 are to be subsequently formed.

At operation 312, the package substrate 22 (e.g., with the IC die 24 mounted thereon and ring stiffener 40 placed thereon) is mounted to a PCB 20. The package substrate 22 may be mounted on the PCB 20 using external connectors 30 (e.g., including solder, which may be reflowed to mount the package substrate 22 on the PCB 20). At operation 314, a heat sink 60 is adhered to the IC die 24, such as by using TIM 68 as described above. In some examples, the heat sink 60 can be secured to the PCB 20, such as by using attachment mechanisms 82 and a bracket 80 as described above. The ring stiffener 40 is disposed between the heat sink 60 and the package substrate 22 and is further disposed around the IC die 24.

At operation 316, a wedge 50 is placed between the ring stiffener 40 and the heat sink 60. The wedge 50 can be placed on a recessed lateral portion 42 of the ring stiffener 40 and in a wedge channel 70 of the heat sink 60. The wedge 50 can be expanded to contact both the ring stiffener 40 and the heat sink 60, and to thereby further ensure that the ring stiffener 40 contacts the package substrate 22.

The sequence of operations in the method 300 is an example. In other examples, different sequences may be implemented. For example, the ring stiffener 40 can be placed around the IC die 24 and on the package substrate 22 in operation 306 at any time after operation 308 and before operation 314. Various other operations are shown for context of some methods, and may be omitted from other example methods.

Figure 16:
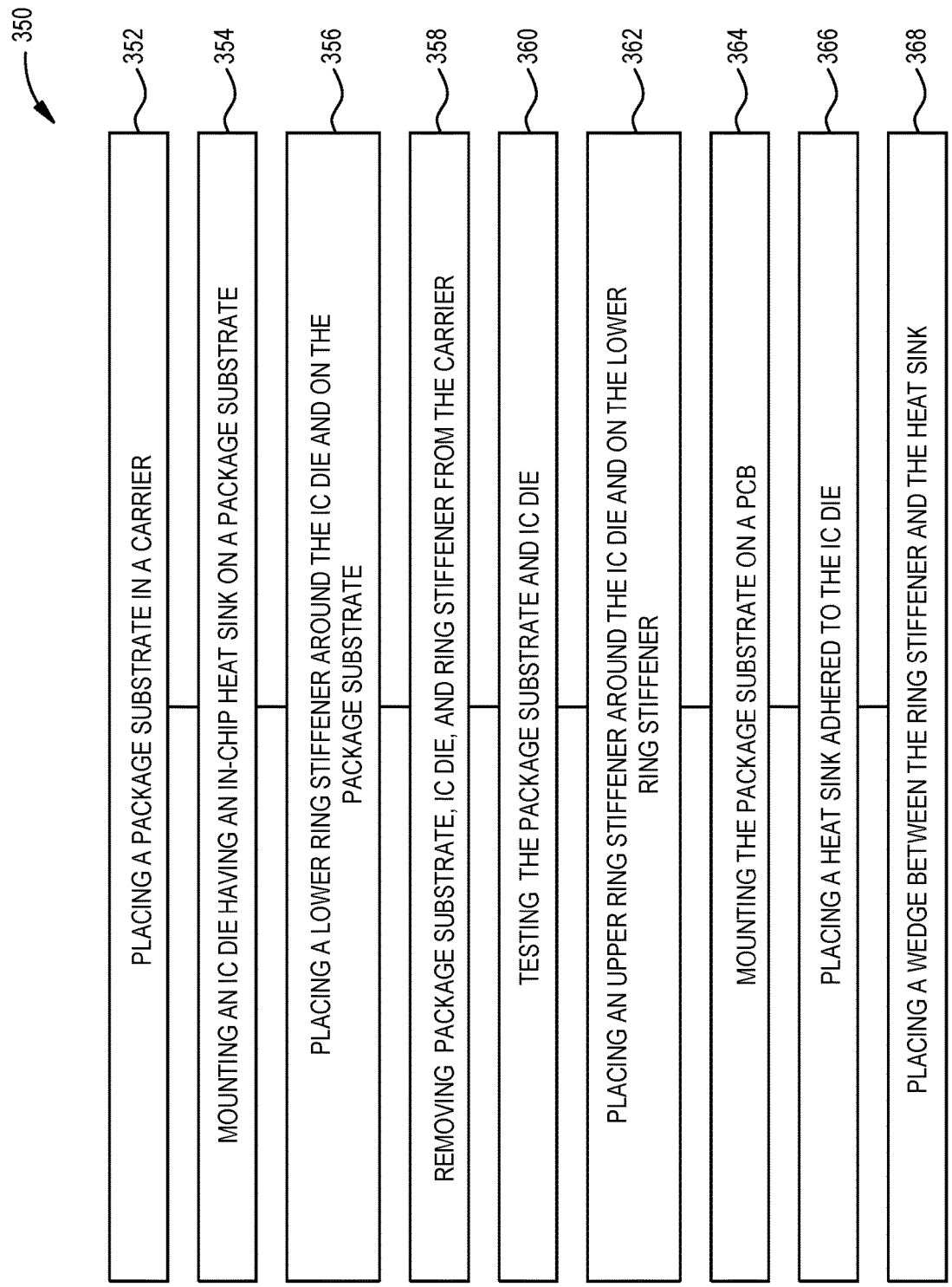
FIG. 16 is flow diagram of another method for fabricating an electronic device apparatus, according to some examples.

FIG. 16 is flow diagram of a method 350 for fabricating an electronic device apparatus, according to some examples. At operation 352, a package substrate 22 is placed in a carrier. As stated previously, the carrier can include a frame with openings into which respective package substrates are placed. The frame and openings can be configured to accommodate the components to be attached to the package substrate 22 while the package substrate 22 is on the carrier. As illustrated herein, a multi-component ring stiffener is to be attached to the package substrate 22. The lower ring stiffener 200 is attached to the package substrate 22 while the package substrate 22 is on the carrier, while the upper ring stiffener 202 is to be joined to the lower ring stiffener 200 at some time after the package substrate 22 is removed from the carrier. Under such conditions, the frame and openings may be configured such that no component extends beyond the package substrate 22.

In operation 354, an IC die 24 having an in-chip heat sink 112 is mounted on the package substrate 22, as described previously with respect to operation 304. At operation 356, a lower ring stiffener 200 is placed around the IC die 24 and on the package substrate 22. The lower ring stiffener 200 can be adhered to the package substrate 22 using an appropriate adhesive, such as a TIM, between the lower ring stiffener 200 and the package substrate 22. At operation 358, the package substrate 22, IC die 24, and lower ring stiffener 200 are removed from the carrier, similar to as described previously with respect to operation 308. At operation 360, the package substrate 22 and IC die 24 are tested, as described previously with respect to operation 310.

At operation 362, an upper ring stiffener 202 is placed around the IC die 24 and on the lower ring stiffener 200. The upper ring stiffener 202 can be adhered to the lower ring stiffener 200 using an appropriate adhesive, such as a TIM, between the upper ring stiffener 202 and the lower ring stiffener 200. By implementing a multi-component ring stiffener as described, the lower ring stiffener 200 can be attached to the package substrate 22 (while in the carrier) to provide structural support during subsequent processing, such as through formation of external connectors 30 (e.g., BGA balls) and testing, without having to retrofit tools or equipment to accommodate a ring stiffener with a lateral extension or overhang portion. As described, the lateral extension or overhang portion provided by the upper ring stiffener 202 can be joined to the lower ring stiffener 200 after, e.g., forming the external connectors 30 and testing, while still achieving a larger surface area provided by the lateral extension or overhang portion in the completed package structure.

At operation 364, the package substrate 22 (e.g., with the IC die 24 mounted thereon and multi-component ring stiffener (including the upper ring stiffener 202 and lower ring stiffener 200) placed thereon) is mounted to a PCB 20, as described previously with respect to operation 312. At operation 366, a heat sink 60 is adhered to the IC die 24, such as by using TIM 68, as described previously with respect to operation 314. At operation 368, a wedge 50 is placed between the ring stiffener 40 and the heat sink 60, as described previously with respect to operation 316.

The sequence of operations in the method 350 is an example. In other examples, different sequences may be implemented. Various operations are shown for context of some methods, and may be omitted from other example methods.

While the foregoing is directed to specific examples, other and further examples may be devised without departing from the basic scope thereof, and the scope thereof is determined by the claims that follow.

What is claimed is:

1. An electronic device apparatus comprising:
a package comprising a die attached to a package substrate;
a ring stiffener disposed around the die and on the package substrate;
a heat sink disposed on the package; and
a wedge disposed between the heat sink and the ring stiffener, wherein the wedge is expandable in a direction extending from the ring stiffener to the heat sink, the wedge contacting the ring stiffener and the heat sink.

2. The electronic device apparatus of claim 1, wherein a thermally conductive path of serially connected metal components is formed through the package substrate, the ring stiffener, and the wedge to the heat sink.

3. The electronic device apparatus of claim 1, wherein the die includes an in-chip heat sink, the in-chip heat sink comprising a metal wall and a through substrate via (TSV) connected to the metal wall, the metal wall comprising vias and lines, the TSV being through a semiconductor substrate portion of the die.

4. The electronic device apparatus of claim 1, wherein:
the die includes an in-chip heat sink;
the die is attached to the package substrate by an external connector;
the package substrate includes a metallization; and
a thermally conductive path is through the in-chip heat sink, the external connector, the metallization of the package substrate, the ring stiffener, and the wedge to the heat sink.

5. The electronic device apparatus of claim 1, wherein the ring stiffener has a lateral portion that extends laterally beyond a corresponding edge of the package substrate, the wedge being disposed on the lateral portion of the ring stiffener.

6. The electronic device apparatus of claim 1, wherein:
the ring stiffener has a lateral portion and an inner portion interior to the lateral portion, the lateral portion having a thickness that is less than a thickness of the inner portion;
the heat sink has a wedge channel; and
the wedge is disposed on the lateral portion of the ring stiffener and in the wedge channel.

7. The electronic device apparatus of claim 1, wherein the ring stiffener is a multi-component ring stiffener comprising:
a lower ring stiffener disposed on the package substrate, the lower ring stiffener having outer lateral edges aligned with or interior to outer lateral edges of the package substrate; and
an upper ring stiffener disposed on the lower ring stiffener, the upper ring stiffener extending laterally outwardly beyond the lateral outer edges of the package substrate.

8. The electronic device apparatus of claim 1, wherein the wedge comprises a first wedge portion, a second wedge portion, and a third wedge portion, a screw shaft being disposed serially through the first wedge portion, the second wedge portion, and the third wedge portion, an interface between the first wedge portion and the second wedge portion and an interface between the second wedge portion and the third wedge portion being configured to force the second wedge portion in a direction opposite from the first wedge portion and the third wedge portion when the screw shaft is screwed into a nut.

9. An electronic device apparatus comprising:
a package comprising an integrated circuit (IC) die;
a ring stiffener around at least a portion of the package and disposed on the package;
a heat sink disposed on the package; and
a wedge disposed between the ring stiffener and the heat sink, wherein a thermally conductive path from the IC die to the heat sink includes the ring stiffener and the wedge.

10. The electronic device apparatus of claim 9, wherein:
the package further comprises a package substrate on which the IC die is mounted;
the package substrate comprises a metallization connected to a contact pad;
the ring stiffener contacting the contact pad; and
the thermally conductive path includes the metallization and the contact pad.

11. The electronic device apparatus of claim 9, wherein:
the IC die comprises an in-chip heat sink;
the in-chip heat sink comprises a wall comprising stacked vias and lines; and
the thermally conductive path includes the in-chip heat sink.

12. The electronic device apparatus of claim 9, wherein:
the package further comprises a package substrate on which the IC die is mounted;
the ring stiffener is disposed on the package substrate;
the ring stiffener has a lateral portion and an inner portion interior to the lateral portion, the lateral portion having a thickness that is less than a thickness of the inner portion, the lateral portion extending laterally beyond the package substrate;
the heat sink has a wedge channel; and
the wedge is disposed on the lateral portion of the ring stiffener and in the wedge channel.

13. The electronic device apparatus of claim 9, wherein:
the package further comprises a package substrate on which the IC die is mounted;
the ring stiffener comprises:
a lower ring stiffener disposed on the package substrate, the lower ring stiffener having outer lateral edges aligned with or interior to outer lateral edges of the package substrate; and
an upper ring stiffener disposed on the lower ring stiffener, the upper ring stiffener extending laterally outwardly beyond the lateral outer edges of the package substrate.

14. The electronic device apparatus of claim 9, wherein the heat sink is adhered to the IC die by a thermal interface material.

15. An electronic device apparatus comprising:
an integrated circuit (IC) die;
a package substrate, the IC die being mounted on a die receiving area of the package substrate, the package substrate having a ring contact area laterally around the die receiving area, the package substrate comprising a metallization connected between a first contact pad in the die receiving area and a second contact pad in the ring contact area;
a ring stiffener around the IC die and on the ring contact area of the package substrate, the ring stiffener being thermally coupled to the second contact pad in the ring contact area;
a heat sink adhered to the IC die; and
a wedge disposed between and thermally coupled to the ring stiffener and the heat sink.

16. The electronic device apparatus of claim 15, wherein the metallization, the ring stiffener, and the wedge form at least a portion of a thermally conductive path between the IC die and the heat sink.

17. The electronic device apparatus of claim 15, wherein:
the IC die includes an in-chip heat sink;
the in-chip heat sink is connected to a third contact pad on the IC die; and
an external connector is connected between the first contact pad and the third contact pad.

18. The electronic device apparatus of claim 15, wherein:
the IC die includes an in-chip heat sink; and
the heat sink is adhered at least partially to the in-chip heat sink by a thermal interface material.

19. The electronic device apparatus of claim 15, wherein:
the ring stiffener has a lateral portion and an inner portion interior to the lateral portion, the lateral portion having a thickness that is less than a thickness of the inner portion;
the heat sink has a wedge channel; and
the wedge is disposed on the lateral portion of the ring stiffener and in the wedge channel.

20. The electronic device apparatus of claim 15, wherein the ring stiffener (i) directly contacts the second contact pad in the ring contact area, or (ii) directly contacts a thermally conductive material on the ring contact area that directly contacts the second contact pad in the ring contact area.

* * * * *